United States Patent
He et al.

(10) Patent No.: US 6,811,815 B2
(45) Date of Patent: Nov. 2, 2004

(54) METHOD FOR ROLL-TO-ROLL DEPOSITION OF OPTICALLY TRANSPARENT AND HIGH CONDUCTIVITY METALLIC THIN FILMS

(75) Inventors: Xiao-Ming He, Arcadia, CA (US); Ramin Heydarpour, Beverly Hills, CA (US)

(73) Assignee: Avery Dennison Corporation, Pasadena, CA (US)

( * ) Notice: Subject to any disclaimer, the term of this patent is extended or adjusted under 35 U.S.C. 154(b) by 207 days.

(21) Appl. No.: 10/172,282

(22) Filed: Jun. 14, 2002

(65) Prior Publication Data

US 2004/0001915 A1 Jan. 1, 2004

(51) Int. Cl.[7] .............................................. C23C 16/00
(52) U.S. Cl. .................. 427/248.1; 349/86; 428/411.1; 528/176; 528/193; 528/196; 528/272
(58) Field of Search ..................... 427/248.1; 349/86; 428/411.1; 528/196, 272, 176, 193

(56) References Cited

U.S. PATENT DOCUMENTS

| | | |
|---|---|---|
| 4,166,876 A | 9/1979 | Chiba et al. |
| 4,345,000 A | 8/1982 | Kawazoe et al. |
| 4,451,525 A | 5/1984 | Kawazoe et al. |
| 4,936,964 A | 6/1990 | Nakamura |
| 5,178,957 A | 1/1993 | Kolpe et al. |
| 5,667,853 A | 9/1997 | Fukuyoshi et al. |
| 5,703,436 A | 12/1997 | Forrest et al. |
| 5,707,745 A | 1/1998 | Forrest et al. |
| 5,721,160 A | 2/1998 | Forrest et al. |
| 5,757,026 A | 5/1998 | Forrest et al. |
| 5,834,893 A | 11/1998 | Bulovic et al. |
| 5,861,219 A | 1/1999 | Thompson et al. |
| 5,904,961 A | 5/1999 | Tang et al. |
| 5,986,401 A | 11/1999 | Thompson et al. |
| 5,998,803 A | 12/1999 | Forrest et al. |
| 6,013,538 A | 1/2000 | Burrows et al. |
| 6,046,543 A | 4/2000 | Bulovic et al. |
| 6,048,573 A | 4/2000 | Tang et al. |
| 6,048,630 A | 4/2000 | Burrows et al. |
| 6,066,357 A | 5/2000 | Tang et al. |
| 6,125,226 A | 9/2000 | Forrest et al. |
| 6,137,223 A | 10/2000 | Hung et al. |
| 6,242,115 B1 | 6/2001 | Thomson et al. |
| 6,274,980 B1 | 8/2001 | Burrows et al. |
| 2002/0093605 A1 * | 7/2002 | Stephenson .................. 349/86 |

FOREIGN PATENT DOCUMENTS

| | | |
|---|---|---|
| EP | 1 041 644 A2 | 10/2000 |
| EP | 1 155 818 A1 | 11/2001 |
| WO | WO 98/12596 | 3/1998 |
| WO | WO 99/36261 | 7/1999 |

* cited by examiner

Primary Examiner—Terressa Boykin
(74) Attorney, Agent, or Firm—Fulwider Patton Lee & Utecht, LLP; Scott R. Hansen

(57) ABSTRACT

Methods for roll-to-roll deposition of optically transparent and high conductivity metallic thin films are disclosed. In general, a method according to the present invention comprises: (1) providing a flexible plastic substrate; (2) depositing a multi-layered conductive metallic film on the flexible plastic substrate by a thin-film deposition technique to form a composite film; and (3) collecting the composite film in continuous rolls. Typically, the thin conductive metallic film is an InCeO—Ag—InCeO film. Typically, the thin-film deposition technique is DC magnetron sputtering. Another aspect of the invention is a composite film produced by a method according to the present invention. Still another aspect of the invention is a composite film comprising InCeO—Ag—InCeO film formed on a flexible plastic substrate, wherein the composite film has a combination of properties including: transmittance of at least 90% throughout the visible region; an electrical resistance of no greater than about 10 Ω/square; a root-mean-square roughness of no greater than about 2.5 nm; and an interlayer adhesion between the InCeO/Ag/InCeO metallic film and the remainder of the composite film that is sufficiently great to survive a 180° peel adhesion test.

133 Claims, 6 Drawing Sheets

TO CENTER AREA

METHOD FOR ROLL-TO-ROLL DEPOSITION OF OPTICALLY TRANSPARENT AND HIGH CONDUCTIVITY METALLIC THIN FILMS

BACKGROUND OF THE INVENTION

1. Field of the Invention

The present invention relates generally to methods for roll-to-roll deposition of optically transparent and high conductivity metallic films for use in plastic display electrodes and other analogous devices, and to composite films made using those methods.

2. General Background and State of the Art

A liquid crystal display (LCD) is a type of flat panel display used in various electronic devices. Generally, LCDs comprise two sheets of polarizing material with a liquid crystal solution therebetween. Each sheet of polarizing material typically comprises a substrate of glass or transparent plastic; a liquid crystal (LC) is used as optical switches. The substrates are usually manufactured with transparent electrodes, typically made of indium tin oxide (ITO) or another conductive metallic layer, in which electrical "driving" signals are coupled. The driving signals induce an electric field which can cause a phase change or state change in the LC material, the LC exhibiting different light-reflecting characteristics according to its phase and/or state.

Liquid crystals can be nematic, smectic, or cholesteric depending upon the arrangement of the molecules. A twisted nematic cell is made up of two bounding plates (usually glass slides or plastic plates), each with a transparent conductive coating (such as ITO or another conductor) that acts as an electrode, spacers to control the cell gap, two cross polarizers (the polarizer and the analyzer), and nematic liquid crystal material. Twisted nematic displays rotate the direction of the liquid crystal by 90°. Super-twisted nematic displays employ up to a 270° rotation. This extra rotation gives the crystal a much deeper voltage-brightest response, also widens the angle at which the display can be viewed before losing much contrast. Cholesteric liquid crystal (CLC) displays are normally reflective (meaning no backlight is needed) and can function without the use of polarizing films or a color filter. "Cholesteric" means the type of liquid crystal having finer pitch than that of twisted nematic and super-twisted nematic. Sometimes it is called "chiral nematic" because cholesteric liquid crystal is normally obtained by adding chiral agents to host nematic liquid crystals. Cholesteric liquid crystals may be used to provide bistable and multistable displays that, due to their nonvolatile "memory" characteristic, do not require a continuous driving circuit to maintain a display image, thereby significantly reducing power consumption. Feroelectric liquid crystals (FLCs) use liquid crystal substances that have chiral molecules in a smectic C type of arrangement because the spiral nature of these molecules allows the microsecond switching response time that makes FLCs particularly suited to advance displays. Surface-stabilized feroelectric liquid crystals (SSFLCs) apply controlled pressure through the use of a glass plate, suppressing the spiral of the molecules to make the switching even more rapid.

Some known LCD devices include chemically-edged transparent, conductive layers overlying a glass substrate. See, e.g., U.S. Pat. No. 5,667,853 to Fukuyoshi et al., incorporated herein by reference. Unfortunately, chemical etching processes are often difficult to control, especially for plastic films. Such processes are also not well-suited for production of the films in a continuous, roll-to-roll manner, on plastic substrates.

There are alternative display technologies to LCDs that can be used, for example, in flat panel displays. A notable example is organic or polymer light-emitting devices (OLEDs) or (PLEDs), which are comprised of several layers in which one of the layers is comprised of an organic material that can be made to electroluminesce by applying a voltage across the device. An OLED device is typically a laminate formed in a substrate such as glass or a plastic polymer. A light-emitting layer of a luminescent organic solid, as well as adjacent semiconductor layers, are sandwiched between an anode and a cathode. The semiconductor layers can be whole-injecting and electron-injecting layers. PLEDs can be considered a subspecies of OLEDs in which the luminescent organic material is a polymer. The light-emitting layers may be selected from any of a multitude of light-emitting organic solids, e.g., polymers that are suitably fluorescent or chemiluminescent organic compounds. Such compounds and polymers include metal ion salts of 8-hydroxyquinolate, trivalent metal quinolate complexes, trivalent metal bridged quinolate complexes, Schiff-based divalent metal complexes, tin (IV) metal complexes, metal acetylacetonate complexes, metal bidenate ligand complexes incorporating organic ligands, such as 2-picolylketones, 2-quinaldylketones, or 2-(o-phenoxy) pyridine ketones, bisphosphonates, divalent metal maleonitriledithiolate complexes, molecular charge transfer complexes, rare earth mixed chelates, (5-hydroxy) quinoxaline metal complexes, aluminum tris-quinolates, and polymers such as poly(p-phenylenevinylene), poly (dialkoxyphenylenevinylene), poly(thiophene), poly (fluorene), poly(phenylene), poly(phenylacetylene), poly (aniline), poly(3-alkylthiophene), poly(3-octylthiophene), and poly(N-vinylcarbazole). When a potential difference is applied across the cathode and anode, electrons from the electron-injecting layer and holes from the hole-injecting layer are injected into the light-emitting layer; they recombine, emitting light. OLEDs and PLEDs are described in the following United States patents, all of which are incorporated herein by this reference: U.S. Pat. No. 5,707,745 to Forrest et al., U.S. Pat. No. 5,721,160 to Forrest et al., U.S. Pat. No. 5,757,026 to Forrest et al., U.S. Pat. No. 5,834,893 to Bulovic et al., U.S. Pat. No. 5,861,219 to Thompson et al., U.S. Pat. No. 5,904,916 to Tang et al., U.S. Pat. No. 5,986,401 to Thompson et al., U.S. Pat. No. 5,998,803 to Forrest et al., U.S. Pat. No. 6,013,538 to Burrows et al., U.S. Pat. No. 6,046,543 to Bulovic et al., U.S. Pat. No. 6,048,573 to Tang et al., U.S. Pat. No. 6,048,630 to Burrows et al., U.S. Pat. No. 6,066,357 to Tang et al., U.S. Pat. No. 6,125,226 to Forrest et al., U.S. Pat. No. 6,137,223 to Hung et al., U.S. Pat. No. 6,242,115 to Thompson et al., and U.S. Pat. No. 6,274,980 to Burrows et al.

In a typical matrix-address light-emitting display device, numerous light-emitting devices are formed on a single substrate and arranged in groups in a regular grid pattern. Activation may be by rows and columns, or in an active matrix with individual cathode and anode paths. OLEDs are often manufactured by first depositing a transparent electrode on the substrate, and patterning the same into electrode portions. The organic layer(s) is then deposited over the transparent electrode. A metallic electrode can be formed over the electrode layers. For example, in U.S. Pat. No. 5,703,436 to Forrest et al., incorporated herein by reference, transparent indium tin oxide (ITO) is used as the whole-injecting electrode, and a Mg—Ag—ITO electrode layer is used for electron injection.

Previous methods of manufacturing such films have not succeeded in manufacturing such films by a continuous process on flexible substrates, yielding films with desirable properties such as high transmittance, low electrical resistance, and stability to temperature and humidity.

For example, PCT Publication No. WO 99/36261, by Choi et al. (Polaroid Corp.) published on Jul. 22, 1999, and incorporated by this reference, describes the deposition of ITO/Au/Ag/Au/ITO multilayered films on polymer (Arton substrate). In this multilayered structure, the Ag layer has a thickness of 10–15 nm and the two ITO layers have a thickness of 35–50 nm. As compared with ITO/Ag/ITO multilayered films, an Au/Ag/Au sandwiched layer works as a conductive layer in the multilayered structure and exhibits an enhanced corrosion resistance as the 1–1.5 nm Au layers prevent the water or oxygen from entering the Au/Ag interfacial area. It was reported that the ITO/Au/Ag/Au/ITO films have a sheet resistance below 10 $\Omega$/square and a transmittance above 80%. However, the deposition process for these multilayered films is much more complicated than the deposition process for ITO/Ag/ITO films.

U.S. Pat. No. 5,667,853 to Fukuyoshi et al., incorporated herein by reference, describes the formation of InCeO/Ag/InCeO films in which the InCeO layers have a thickness of about 35–50 nm and the Ag layer has a thickness of about 10–15 nm. The InCeO films were deposited by sputtering a target that was formed by doping 10–30% $CeO_2$ into $In_2O_3$. The cerium can effectively block the diffusion of oxygen atoms from the InCeO films to the InCeO/Ag interfacial layer. On the other hand, the Ag layer actually contains 1 atom percent Au and 0.5 atom percent Cu to enhance the stability of Ag atoms in the Ag layer. The design of the chemical compositions in both the InCeO and the Ag layers was reported to effectively improve the structural stability of the InCeO/Ag/InCeO films. The InCeO/Ag/InCeO films exhibit a low sheet resistance of 3–5 $\Omega$/square and a high optical transmittance of above 90%. The deposition of InCeO/Ag/InCeO films films was also disclosed in U.S. Pat. No. 6,249,082 to Fukuyoshi et al., incorporated by this reference. However, the deposition of these films was only performed on a rigid glass substrate. The invention was not applied to the actual manufacture of information displays.

Other methods for producing such films are described in U.S. Pat. No. 4,166,876 to Chiba et al., U.S. Pat. No. 4,345,000 to Kawazoe et al., U.S. Pat. No. 4,451,525 to Kawazoe et al., U.S. Pat. No. 4,936,964 to Nakamura, U.S. Pat. No. 5,178,957 to Kolpe et al., U.S. Pat. No. 6,171,663 to Hanada et al., U.S. Published Patent Application No. US 2001/0050222 by Choi et al., PCT Patent Publication No. WO 98/12596 by Staral et al., European Patent Publication No. EP 1041644 by Cheung, and European Patent Publication No. EP 1155818, all of which are incorporated herein by this reference.

Accordingly, there is still a need for an improved method of preparing conductive films on a flexible substrate. There is a particular need for methods that can be used to prepare such films in a continuous, roll-to-roll manner, so that the films can be collected in continuous rolls.

INVENTION SUMMARY

In general; a method for forming a composite film according to the present invention comprises:
(a) providing a flexible plastic substrate;
(b) depositing a multi-layered conductive metallic film continuously on the flexible plastic substrate to form a composite film; and
(c) collecting the composite film in continuous rolls.

The thin-film deposition technique can be DC or RF magnetron sputtering, ion beam deposition, chemical vapor deposition, ion beam enhanced deposition, and laser ablation deposition. A preferred thin film deposition technique is DC magnetron sputtering.

Typically, the thin film that is deposited is an InCeO/Ag/InCeO film with three layers, with exterior InCeO layers surrounding an interior Ag layer. However, methods according to the present invention can be used to deposit other metallic films.

Typically, the DC magnetron sputtering is performed in an atmosphere that contains argon, and, optionally, oxygen. Preferably, the atmosphere contains oxygen in the deposition of InCeO films. The oxygen concentration can be varied to optimize the properties of the thin film being deposited.

The method can further comprise the step of purging the surface of the flexible plastic substrate with plasma prior to film deposition. The method can also further comprise a post-deposition annealing step.

Typically, the flexible plastic substrate is polyethylene terephthalate (PET), polyethylene naphthalate (PEN), polyethersulfone (PES), polycarbonate (PC), polysulfone, a phenolic resin, an epoxy resin, polyester, polyimide, polyetherester, polyetheramide, cellulose acetate, aliphatic polyurethanes, polyacrylonitrile, polytetrafluoroethylenes, polyvinylidene fluorides, poly(methyl $\alpha$-methacrylates) or an aliphatic or cyclic polyolefin. Aliphatic polyolefins include, but are not necessarily limited to, high density polyethylene (HDPE), low density polyethylene (LDPE), and polypropylene, including oriented polypropylene (OPP). Cyclic polyolefins include, but are not necessarily limited to, poly(bis(cyclopentadiene)). A preferred flexible plastic substrate is a cyclic polyolefin or a polyester. The flexible plastic substrate can be reinforced with a hard coating. Typically, the hard coating is an acrylic coating.

Typically, a composite film formed according to the present invention has superior properties, including high optical transmittance, low electrical resistance, high surface smoothness, high stability to exposure to high temperature and high humidity, high interlayer adhesion, and wet and dry etchability.

A further aspect of the invention is a novel composite film comprising a InCeO/Ag/InCeO metallic film coated or deposited on a flexible plastic substrate, wherein the composite film has a combination of properties including: transmittance of at least 80% throughout the visible region; an electrical resistance of no greater than about 20 $\Omega$/square, preferably no greater than 10 $\Omega$/square; a root-mean-square roughness of no greater than about 5 nm; and an interlayer adhesion between the InCeO/Ag/InCeO metallic film and the remainder of the composite film that is sufficiently great to survive a 180° peel adhesion test. Preferably, the composite film further includes a reinforcing hard coating, preferably an acrylic coating, between the InCeO/Ag/InCeO metallic film and the flexible plastic substrate.

A preferred embodiment of the composite film includes the following properties: transmittance of at least 90% throughout the visible region; an electrical resistance of no greater than about 5 $\Omega$/square; and a root-mean-square roughness of no greater than about 2.5 nm.

Typically, the flexible plastic substrate of the composite film is polyethylene terephthalate (PET), polyethylene naphthalate (PEN), polyethersulfone (PES), polycarbonate (PC), polysulfone, a phenolic resin, an epoxy resin, polyester, polyimide, polyetherester, polyetheramide, cellulose acetate, aliphatic polyurethanes, polyacrylonitrile, polytetrafluoroethylenes, polyvinylidene fluorides, poly (methyl α-methacrylates) or an aliphatic or cyclic polyolefin, as described above. A preferred flexible plastic substrate is a cyclic polyolefin or a polyester.

Yet another aspect of the present invention is a multilayered electrode/substrate structure comprising an etched composite film made according to the present invention. The multilayered electrode/substrate structure can be an OLED or a PLED.

The conductive material can be a light-emitting polymer. The polymer can be poly(p-phenylenevinylene) (PPV), poly (dialkoxyphenylenevinylene), poly(thiophene), poly (fluorene), poly(phenylene), poly(phenylacetylene), poly (aniline), poly(3-alkylthiophene), poly(3-octylthiophene), or poly(N-vinylcarbazole).

Alternatively, the multilayered electrode/substrate structure can include a conductive material that is a luminescent organic or organometallic material. The luminescent organic or organometallic material can be selected from the group consisting of metal ion salts of 8-hydroxyquinolate, trivalent metal quinolate complexes, trivalent metal bridged quinolate complexes, Schiff base divalent metal complexes, tin (IV) metal complexes, metal acetylacetonate complexes, metal bidentate ligand complexes incorporating an organic ligand selected from the group consisting of 2-picolylketones, 2-quinaldylketones, and 2-(o-phenoxy) pyridine ketones, bisphosphonates, divalent metal maleonitriledithiolate complexes, molecular charge transfer complexes, rare earth mixed chelates, (5-hydroxy) quinoxaline metal complexes, and aluminum tris-quinolates.

BRIEF DESCRIPTION OF THE DRAWINGS

These and other features, aspects, and advantages of the present invention will become better understood with reference to the following description, appended claims, and accompanying drawings where:

DETAILED DESCRIPTION OF THE PREFERRED EMBODIMENTS

Figure 1:
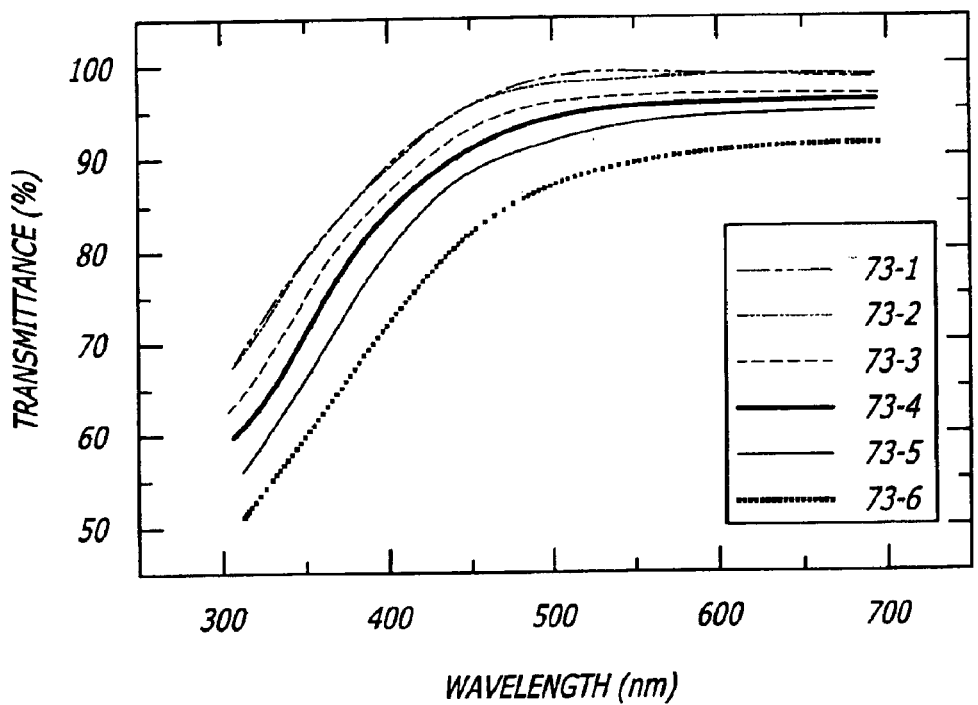
FIG. 1 is a graph showing the transmittance across the visible spectrum of several samples of InCeO films deposited on PET.

The invention provides a method for roll-to-roll deposition of highly conductive, transparent metallic films on flexible plastic substrates, for example to develop flexible display electrodes. The invention also provides for a composite film that has a balance of properties including transmittance of at least 80% throughout the visible region; an electrical resistance of no greater than about 20 Ω/square, more preferably no greater than about 10 Ω/square; a root-mean-square roughness of no greater than about 5 nm; and an interlayer adhesion between the InCeO/Ag/InCeO metallic film and the remainder of the composite film that is sufficiently great to survive a 180° peel adhesion test. As used in the specification and claims of this patent application, "composite film" refers to flexible sheeting that is the composite of a thin conductive metallic film and a flexible plastic substrate on which the metallic film is deposited or formed. The preferred highly conductive, transparent metallic material comprises InCeO/Ag/InCeO film. Preferably, the composite film further includes a reinforcing hard coating between the thin conductive metallic film and the flexible plastic substrate.

I. Methods for Roll-to-Roll Deposition

A. Thin-Film Deposition Methods

In general, a method for forming a composite film according to the present invention comprises:

(1) providing a flexible plastic substrate;

(2) depositing a multi-layered conductive metallic film continuously on the flexible plastic substrate by a thin-film deposition technique to form a composite film; and (3) collecting the composite film in continuous rolls The thin-film deposition technique can be DC or RF magnetron sputtering, ion beam deposition, chemical vapor deposition, ion beam enhanced deposition, or laser ablation deposition. Preferably, the thin-film deposition technique is DC magnetron sputtering.

For DC magnetron sputtering, the sputtering is performed in a maximum sputter power of from about 300 watts to about 2000 watts. Preferably, the DC magnetron sputtering is performed at a sputter power sequence of from about 500 watts to about 800 watts, followed by from about 50 watts to about 100 watts, followed by from about 500 watts to about 800 watts. More preferably, the DC magnetron sputtering is performed at a sputter power sequence of about 600 watts, followed by about 70 watts, followed by about 600 watts.

Typically, the deposition distance for DC magnetron sputtering is from about 2 inches to about 12 inches. Preferably the deposition distance for DC magnetron sputtering is from about 9 inches to about 11 inches. More preferably, the deposition distance for DC magnetron sputtering is about 10 inches.

Typically, the DC magnetron sputtering is performed in an atmosphere that contains argon, and, optionally, oxygen, and has a pressure of 2–4 mT. Preferably, the atmosphere contains oxygen. Preferably, the flow rate of oxygen is from about 0.2 to about 2.0 standard cubic centimillitor. More preferably, the flow rate of oxygen is from about 0.2 to about 1.0 standard cubic centimillitor. Still more preferably, the flow rate of oxygen is from about 0.2 to about 0.6 standard cubic centimillitor. Preferably, the flow rate of argon is from about 5.0 to about 20.0 standard cubic centimillitor. Still more preferably, the flow rate of argon is about 10 standard cubic centimillitor.

Typically, the line speed during deposition is up to 4 feet/min. Preferably, the line speed during deposition is from about 0.6 to about 1.0 feet/min. When the deposited film is an InCeO/Ag/InCeO film, preferably, the line speed during deposition is about 0.7 feet/min during deposition of the InCeO layers and is about 0.8 feet/min during deposition of the Ag layers. The line speed is adjusted to control the thickness of the InCeO and the Ag layers in the deposition. The line speed can also be adjusted to be optimum for the target size used and for the scale of the deposition process.

In one preferred embodiment, deposition occurs on a 12-inch wide web of the flexible plastic substrate, there are four magnetron sputtering sources cooled by a source of cooling water, and the target is 6 inches in diameter. Other suitable arrangements are known.

B. Structure of the Composite Film

The thin conductive metallic film can be an InCeO/Ag/InCeO film. Typically, the thickness of the InCeO layers is from about 10 nm to about 60 nm and the thickness of the Ag layer is from about 5 nm to about 20 nm. Preferably, the thickness of the InCeO layers is from about 30 nm to about 45 nm and the thickness of the Ag layer is from about 12 nm to about 16 nm.

Typically, the InCeO layer has a composition close to that of the InCeO target and has an amorphous structure. After annealing, the InCeO film still has an amorphous structure.

Typically, the Ag layer contains about 1 atom percent of Au and about 0.5 atom percent of Cu to enhance the stability of the silver atoms in the silver layer.

In still another alternative, the thin conductive metallic film is selected from the group consisting of silver, gold, or their alloys. Other conductive metals can also be used.

The flexible plastic substrate can be any flexible self-supporting plastic film that supports the thin conductive metallic film. "Plastic" means a high polymer, usually made from polymeric synthetic resins, which may be combined with other ingredients, such as curatives, fillers, reinforcing agents, colorants, and plasticizers. Plastic includes thermoplastic materials and thermosetting materials.

The flexible plastic film must have sufficient thickness and mechanical integrity so as to be self-supporting, yet should not be so thick as to be rigid. Typically, the flexible plastic substrate is the thickest layer of the composite film (for example, 200 $\mu$m in thickness). Consequently, the substrate determines to a large extent the mechanical and thermal stability of the fully structured composite film. An exemplary preferred flexible substrate, therefore, is formed from a material that is stable at 130° C. for 6 hours, resistant to 1" mandrel tracking, and >2H pencil hardness.

Another significant characteristic of the flexible plastic substrate material is its Tg. Tg is defined as the glass transition temperature at which plastic material will change from the glassy state to the rubbery state. It may comprise a range before the material may actually flow. Suitable materials for the flexible plastic substrate include thermoplastics of a relatively low glass transition temperature (up to 150° C.), as well as materials of a higher glass transition temperature (above 150° C.). The choice of material for the flexible plastic substrate would depend on factors such as manufacturing process conditions (e.g. deposition temperature, and annealing temperature) and as well as post-manufacturing conditions (e.g. in a process line of a displays manufacturer). Certain of the plastic substrates discussed below can withstand higher processing temperatures of up to at least about 200° C. (some to 300 °–350° C.) without damage.

Typically, the flexible plastic substrate is polyethylene terephthalate (PET), polyethylene naphthalate (PEN), polyethersulfone (PES), polycarbonate (PC), polysulfone, a phenolic resin, an epoxy resin, polyester, polyimide, polyetherester, polyetheramide, cellulose acetate, aliphatic polyurethanes, polyacrylonitrile, polytetrafluoroethylenes, polyvinylidene fluorides, poly(methyl (x-methacrylates) or an aliphatic or cyclic polyolefin. Aliphatic polyolefins include, but are not necessarily limited to, high density polyethylene (HDPE), low density polyethylene (LDPE), and polypropylene, including oriented polypropylene (OPP). Cyclic polyolefins include, but are not necessarily limited to, poly(bis)cyclopentadiene)). A preferred flexible plastic substrate is a cyclic polyolefin or a polyester.

Various cyclic polyolefins are suitable for the flexible plastic substrate. Examples include Arton™ made by Japan Synthetic Rubber Co., Tokyo, Japan; Zeanor™ made by Zeon Chemicals L.P., Tokyo Japan; and Topas™ made by Celanese A. G., Kronberg Germany. Arton is a poly(bis (cyclopentadiene)) condensate that is a film of a polymer and that has the formula

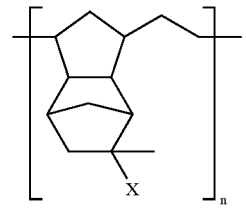

in which X is a polar group.

Alternatively, the flexible plastic substrate can be a polyester. A preferred polyester is an aromatic polyester such as Arylite.

The flexible plastic substrate can be reinforced with a hard coating. Such a hard coating typically has a thickness of from about 1 $\mu$m to about 15 $\mu$m, preferably from about 2 $\mu$m to about 4 $\mu$m, and can be provided by free radical polymerization (initiated either thermally or by ultraviolet radiation) of an appropriate polymerizable material. Depending on the substrate, different hard coatings can be used. When the substrate is polyester or Arton, a particularly preferred hard coating is the coating known as "Lintec." Lintec contains UV-cured polyester acrylate and colloidal silica; when deposited on Arton, it has a surface composition of 35 atom % C, 45 atom % O, and 20 atom % Si, excluding hydrogen. Another particularly preferred hard coating is the acrylic coating sold under the trademark "Terrapin" by Tekra Corporation, New Berlin, Wisconsin.

Applicants have observed that the hard coating provides significant improvement in certain properties of the composite film, such as improved interlayer adhesion between the transparent conductive metallic film and the hard coating, and a reduction in roughness of the composite film. Significant effects of the hard coating may include an improvement in surface morphology (the hard coating acts as a planarizing layer, reducing roughness) and the chemical bond between the conductive metallic layer and the acrylic hard coating layer. In the event that the composite film is to be laser etched to form electrodes, the hard coating may facilitate the etching process, as discussed in commonly assigned U.S. patent application Ser. No. 10/008,808, filed Nov. 13, 2001. Accordingly, the use of a hard coating is preferable in

C. Pre-Deposition Purging Step

A method according to the present invention can further comprise a pre-deposition purging step. This step comprises the step of purging the surface of the flexible plastic substrate with a plasma prior to film deposition. The plasma can be Ar+O$_2$, Ar, or Ar+N. Plasmas of other gases can also be used. The use of a pre-deposition plasma step can improve interlayer adhesion of a composite film according to the present invention.

D. Post-Deposition Annealing Step

A method according to the present invention can further comprise a post-deposition annealing step. Typically, the post-deposition annealing step comprises annealing the film at a temperature of between about 130° C. and about 250° C. for from about 0.5 hr to about 2 hrs. Post-deposition annealing is carried out at ambient conditions. The use of a post-deposition annealing step can improve interlayer adhesion of a composite film according to the present invention.

In contrast to the annealing process of U.S. Pat. No. 5,667,853 to Fukuyoshi, for glass based constructions, the temperature of the present annealing process is limited by the properties of the composite film. This annealing process has been found to provide significant improvements in interlayer adhesion in many cases. Certain appearance properties of the composite film, notably color and brightness, also must be considered in establishing suitable annealing conditions. These effects are further described in the Examples.

D. Desirable Properties of the Composite Film

Typically, the composite film has a transmittance of at least 80% at a visible light wavelength reference point. Preferably, the transmittance is at least about 90%.

Typically, the composite film has an electrical resistance of no greater than about 20 Ω/square. Preferably, the composite film has an electrical resistance of no greater than about 10 Ω/square. More preferably, the composite film has an electrical resistance of no greater than about 5 Ω/square.

Typically, the composite film has a root-mean-square roughness of no greater than about 5 nm. Preferably, the composite film has a root-mean-square roughness of no greater than about 2.5 nm. More preferably, the composite film has a root-mean-square roughness of no greater than about 1.3 nm.

Typically, the composite film is stable to a 500-hour exposure at 60° C. at 90% relative humidity.

Preferably, the composite film has interlayer adhesion sufficiently great to survive a 180° peel adhesion test. Further details of this test are provided in the Example. Interlayer adhesion is a critical property during use of the composite film, in which there may be a tendency of the composite film to delaminate between the conductive metallic film and the remainder of the construction on aging, or during processing. Interlayer adhesion of a composite film according to the present invention can be improved by the use of pre-deposition plasma purging, post-deposition annealing, or the use of a hard coating in the composite film, as disclosed above.

Preferably, the composite film is wet and dry etchable; alternatively, the composite film, including a hard coating, is laser etchable.

Preferably, the composite film has a brightness L of at least about 80.0%, a red to green shift a of between about 0 and about −7.00 and a blue to yellow shift b of between about 0 and about 7.00. Further details as to the measurement of the brightness, the red to green shift, and the blue to yellow shift are provided in the Example.

II. Composite Films Made by the Process of the Invention

Another aspect of the present invention is a composite film made by the process described above. Preferably, the thin-film deposition technique is DC magnetron sputtering as described above.

Preferably, the DC magnetron sputtering is performed in an atmosphere that contains argon and oxygen.

Preferably, the thin conductive metallic film is an InCeO/Ag/InCeO film as described above.

Preferably, the flexible plastic substrate is a cyclic polyolefin.

The composite film preferably has the desirable properties described above, including high transmittance, low electrical resistance, low root-mean-square roughness, stability to high temperatures at high relative humidity, and high interlayer adhesion. Preferably, the composite film is wet and dry etchable; alternatively, if a hard coating is used, preferably the film is laser etchable.

Another aspect of the present invention is a composite film comprising an InCeO/Ag/InCeO metallic film coated or deposited on a flexible plastic substrate, wherein the composite film: (1) has a transmittance of at least 80% in the visible region; (2) has an electrical resistance of no greater than about 20 Ω/square, preferably no greater than about 10 Ω/square, more preferably no greater than about 5 Ω/square; (3) has a root-mean-square roughness of no greater than about 5 nm, preferably no greater than about 2.5 nm, more preferably no greater than about 1.3 nm; and (4) has an interlayer adhesion between the InCeO/Ag/InCeO metallic film and other elements of the composite film that is sufficiently great to survive a 180° peel adhesion test. Preferably, in this aspect of the present invention, the transmittance is at least 90% through the visible region, the electrical resistance is no greater than about 5 Ω/square, and the root-mean-square roughness is no greater than about 2.5 nm. More preferably, the composite film has a root-mean-square roughness of no greater than about 1.3 nm. In this aspect of the present invention, the composite film can further comprise a reinforcing hard coating located between the InCeO/Ag/InCeO metallic film and the flexible plastic substrate. Typically, the reinforcing hard coating is an acrylic coating. Typically, the flexible plastic substrate is as described above.

III. Multilayered Electrode/Substrate Structures

Another aspect of the present invention is a multilayered electrode/substrate structure comprising a composite film according to the present invention, i.e., a composite film made according to the process described above, that has been wet etched or dry etched to form electrodes. A preferred dry etching process is disclosed in commonly assigned U.S. patent application Ser. No. 10/008,808, filed Nov. 13, 2001.

The multilayered electrode/substrate structure can be an OLED or a PLED. Preferably, the multilayered electrode/substrate structure has surface roughness of less than about 8 nm. More preferably, the multilayered electrode/substrate structure has surface roughness of less than about 5 nm. Still more preferably, the multilayered electrode/substrate structure has surface roughness of less than 2.5 nm.

Preferably, the multilayered electrode/substrate structure has a driving voltage of less than about 20 volts.

The multilayered electrode/substrate structure can include a conductive material that is a light-emitting polymer.

Typically, the light-emitting polymer is selected from the group consisting of poly p-phenylenevinylene (PPV), poly (dialkoxyphenylenevinylene), poly(thiophene), poly (fluorene), poly(phenylene), poly(phenylacetylene), poly (aniline), poly(3-alkylthiophene), poly(3-octylthiophene), and poly(N-vinylcarbazole). Preferably, the light-emitting polymer is poly(p-phenylenevinylene) (PPV) or poly (fluorene). In another alternative, the multilayered electrode/substrate structure includes a conductive material that is a luminescent organic or organometallic material.

The luminescent organic or organometallic material is typically selected from the group consisting of metal ion salts of 8-hydroxyquinolate, trivalent metal quinolate complexes, trivalent metal bridged quinolate complexes, Schiff base divalent metal complexes, tin (IV) metal complexes, metal acetylacetonate complexes, metal bidentate ligand complexes incorporating an organic ligand selected from the group consisting of 2-picolylketones, 2-quinaldylketones, and 2-(o-phenoxy) pyridine ketones, bisphosphonates, divalent metal maleonitriledithiolate complexes, molecular charge transfer complexes, rare earth mixed chelates, (5-hydroxy) quinoxaline metal complexes, and aluminum tris-quinolates.

The multilayered electrode/substrate structures can be incorporated into devices such as touch panels or flex circuits.

The invention is illustrated by the following Example. This Example is for illustrative purposes only and is not intended to limit the invention.

EXAMPLE

I. Experimental Procedure

Substrate materials were the different polymer plastics. Table 1 lists the properties of the plastic substrates selected for the deposition of InCeO/Ag/InCeO films. The hard coating on Lintec Arton has a surface composition of 35 at % C, 45 at % 0, and 20 at % Si, excluding hydrogen, and contains UV cured polyester acrylate and colloidal silica.

An $In_2O_3$-10%$CeO_2$ target was sputtered with a power of 500–800W, for the deposition of InCeO films. In the depositions, the gas flow-rate ratio of $O_2$/Ar was controlled in a range of (0–2)/10 sccm and the line speed of the plastic roll was about 0.3–1.2 feet/min. An alloyed Ag layer was deposited by sputtering an Ag-1.0 at% Au-0.5 at% Cu target with a power of 50–80 W. The sputtering gas was Ar at a flow rate of 10 sccm and the line speed was about 0.7–0.8 feet/min. The line speed was adjusted to control the thickness of the deposited films. The distance between the plastics and the targets was 10 inches for depositions of both InCeO and Ag layers.

Characterization of the InCeO/Ag/InCeO films was correlated with the deposition processing, to reach the optimal performance of the films. The thickness and refractive index of the InCeO/Ag/InCeO films were measured with an Ellipsometer. The chemical composition was characterized with XPS spectrum. A Digital Instruments Nanoscope III Atomic Force Microscope (AFM) and an optical microscope were used to observe and evaluate the surface morphology and roughness. The sheet resistance was measured using a 4-probe conductivity tester (Loresta). An ultraviolet/visible spectrometer (UV/VIS) and a colorometer (Hunter) were applied to measure the visible light transmittance and to characterize the color and the brightness of the deposited films.

Interlayer adhesion of the films was evaluated using a 180° peel test method with 3M tapes 810 or 600. The gauge length was 1 inch and the cross-head speed was 12 in/min. Before the test, the tape was kept on the sample surface for a 20-hours dwelling time. During the test, the lamination pressure was 4 and one-half pound roller was used.

TABLE 1

Properties of plastic rolls used for the film deposition.

| Plastics for deposition | Arton | Aromatic Polyester | PEN | PET | HC/Arton Lintec | HC/PET Autotype |
|---|---|---|---|---|---|---|
| Grade | JSFR G-7810 | Ferrania AryLite | KALADEX S1020/500 | Dupont Teijin Film, ST-504 | CHC-PN188 W PFW | AutoFlex EBA180 L |
| Thickness ($\mu$m) | 188 | 115 | 125 | 175 | 188 | 180 |
| Surface RMS (nm) | 3.7 | 5 | 2.0 | 5.2 | 2.3 | Not tested. |
| Tg (C) | 171 | 330 | 120 | 78 | 171 | 78 |
| Barrier (g/m$^2$/day) (° C./RH) | 35.1 (40/100) | 200 (22/50) | — | 3.41 (40/100) | 31.4 (40/100) | similar to PET, Not tested. |
| Surface energy (mN/M) | 38.9 | 40.7 | 43.8 | 43.3 | 36.3 | 40.4–42.0 |
| Transmittance (@ 550 nm) | 91.31 | 87.04 | 85 | >85 | 91.14 | 89 |

In addition, silicon wafer and glass were used as the substrate materials for the deposition.

Deposition experiments were carried out using Avery Sputtering System with the DC magnetron sputtering mode and the roll-to-roll substrate transportation.

The base pressure of the deposition chamber was 1.5–4× $10^{-3}$ mT, and the working or deposition pressure was 2.4–3.1 mT. Prior to film deposition, the plastic roll was purged with Ar+$O_2$ plasma to modify the surface chemistry of plastic materials. For the optimization of the plasma purging, the sputtering power was changed from 600 to 1200 W, and the gas flow-rate ratio of $O_2$/Ar was adjusted as 8/20, 8/40, 8/80, 4/40, and 5/50 sccm, respectively.

Post treatments of annealing and aging were applied on the InCeO/Ag/InCeO films deposited on different plastics, to investigate the influences on the properties, the interfacial adhesion, and the structure stability. The annealing process was in air with a temperature of 80–245° C. and a time of 30–120 min. The aging was carried out at conditions of 60° C. and 90% relative humidity (RH) for 500 hours.

II. Results and Analysis

A. Deposition and Characterization of InCeO/Ag/InCeO Films

Deposition of InCeO and Ag Films.

The InCeO and Ag films were first deposited on plastic rolls, respectively. The deposition was performed to investigate the optical and electrical properties, and to control the thickness of the InCeO and Ag films, in order to do the following deposition of InCeO/Ag/InCeO films.

Table 2 shows the thickness and properties of the InCeO films deposited on PET. The transmittances of the samples whose properties are given in Table 2 are shown in FIG. 1; FIG. 1 plots the transmittance as a function of wavelength across the visible spectrum. The InCeO film was prepared at conditions of an $O_2$/Ar flow ratio of 0.4/10 sccm (a pressure of 2.6 mT) and a sputtering power of 600 W. It can be seen that variation of the InCeO thickness, from 8.7 to 42.8 nm, is correlated with that of the line speed, from 3.5 to 0.4 feet/min.

TABLE 2

Thickness and properties of InCeO films deposited on PET

I.

| Sample ID | 73-1 | 73-2 | 73-3 | 73-4 | 73-5 | 73-6 | 49-4 |
|---|---|---|---|---|---|---|---|
| Line speed (feet/min) | 3.5 | 3.0 | 2.5 | 2.0 | 1.5 | 1.0 | 0.4 |
| Thickness (nm) | 8.7 | 10 | 12.3 | 16.5 | 21.3 | 34.2 | 42.8 |
| Rs (ohm/sq) | ∞ | 330 K | 76 K | 36.5 K | 22.7 K | 11.3 K | 17.3 K |
| T % (@ 550 nm) | 97.33 | 98.18 | 97.04 | 95.74 | 94.5 | 90.71 | 89.74 |

Data in Table 2 and FIG. 1 show that the increase of InCeO thickness results in the reductions of both sheet resistance and optical transmittance. However, even when the thickness is increased to 42.8 nm, InCeO film still has a high sheet resistance of 17.3 k ohm/sq (see Table 2).

Table 3 shows the thickness and properties of the Ag films prepared under a sputtering power of 68 W and an Ar pressure of 2.6 mT (Ar flow rate of 10 sccm). It can be seen that the Ag thickness is controlled by the adjustment of the line speed. When the thickness is less than 5 nm, the sheet resistance is suddenly increased above 140 ohm/sq, suggested a discontinuous Ag layer formed on the PET substrate.

TABLE 3

Thickness and properties of Ag films deposited on PET

II.

| Sample ID | 72-1 | 72-2 | 72-3 | 72-4 | 72-5 | 72-6 | 72-7 |
|---|---|---|---|---|---|---|---|
| Line speed (feet/min) | 0.2 | 0.4 | 0.8 | 1.0 | 1.5 | 2.5 | 3.5 |
| Thickness (nm) | 47.7 | 26.7 | 12.3 | 10 | 6.53 | 4.7 | 2.3 |
| Rs (ohm/sq) | 0.79 | 2.23 | 6.12 | 7.18 | 14.23 | 144.80 | 26073 |
| T % (@ 550 nm) | 3.39 | 27.97 | 67.31 | 71.48 | 80.52 | 71.73 | 65.99 |

Usually, Ag film has a low optical transmittance (see Table 3) and a blue color (J. Stollenwerk, B. Ocker, and K. H. Kretschmer, "Traneparent conductive multilayer-systems for FPD applications", 95' Display Manufacturing Technology Conference, Society for Information Display, (1995) p. 111–112). The InCeO film, on the other hand, has a high refractive index (U.S. Pat. No. 5,667,853 to Fukuyoshi et al.). If an Ag layer is embedded between two InCeO layers, the InCeO films will promote the formed multi-layers to have a high transmittance. Therefore, it is speculated that the InCeO/Ag/InCeO structure will be benefited from Ag layer for a high conductance and from InCeO layers for a high optical transmittance.

InCeO/Ag/InCeO Films on Different Substrate Materials

The InCeO/Ag/InCeO film was deposited on silicon wafer, glass, and plastics such as Arton, PEN, and PET, to identify the performance stability of the film on different materials. The sputtering powers of 600, 68, and 600 W were used for the deposition of bottom InCeO, Ag, and top InCeO films, respectively. An Ar gas flow was 10 sccm in the deposition process where an $O_2$ gas flow of 0.4 sccm was added in the deposition of InCeO layers. Table 4 lists the thickness and properties of InCeO/Ag/InCeO films deposited on these substrates. The sheet resistance is an average value from an area of φ2 inches.

TABLE 4

Thickness and properties of InCeO/Ag/InCeO films InCeO (top)-Ag-InCeO (bottom)

| Sample ID | $O_2$ (sccm) | Thickness (nm) | T % (@ 550 nm) | Rs (Ω/sq) |
|---|---|---|---|---|
| 76-Glass | 0.4-0-1.0 | 43.6-14.5-38.5 | 91.73 | 7.16 |
| 69-PEN | 0.4-0-1.0 | 36.6-13.6-33.5 | 99.05 | 6.48 |
| 62-PET | 1.0-0-1.0 | 35.7-11.8-32.9 | 97.70 | 5.62 |
| 69-Arton | 0.4-0-1.0 | 36.6-13.6-33.5 | 95.86 | 5.07 |
| 76-Si | 0.4-0-1.0 | 44.2-13.7-46.5 | — | 3.30 |

Data in Table 4 show that when the InCeO/Ag/InCeO films were deposited with almost the same thickness, the sheet resistance of the films is decreased as the substrate materials changed from glass, plastics, to silicon. The films prepared on silicon exhibit the lowest sheet resistance of 3.3 ohm/sq. It is clear that the substrate materials affect the properties of the InCeO/Ag/InCeO films as the sheet resistance of the coated films is decreased with the increase of the electrical conductivity of the substrate materials.

Deposition of InCeO/Ag/InCeO Films on Plastic Rolls

Figure 2:
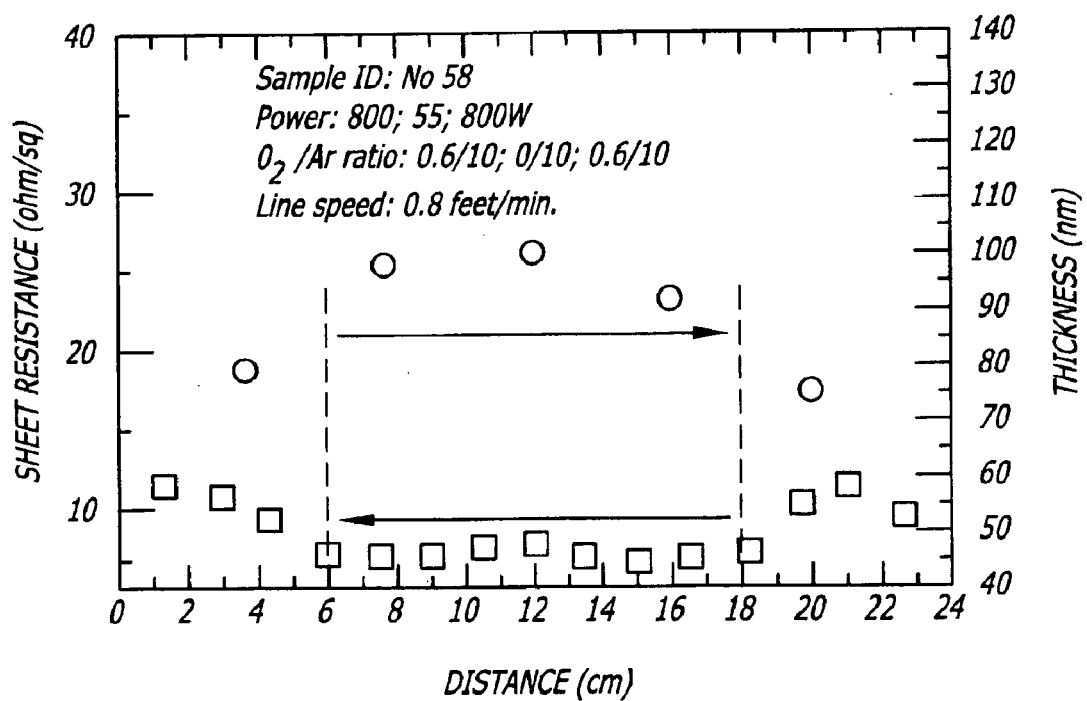
FIG. 2 is a graph showing the thickness and sheet resistance of InCeO/Ag/InCeO films deposited on Arton.

The InCeO/Ag/InCeO films were then deposited on different plastic rolls to investigate the variations of the sheet resistance and the optical transmittance. FIG. 2 shows the cross-sectional distributions of the sheet resistance and thickness of the InCeO/Ag/InCeO film on Arton, in which the thickness is depicted by the circles, and the sheet resistance by the squares. The deposition parameters are inside the picture. Table 5 shows the thickness of InCeO, Ag, and InCeO layers at different cross-directional area in FIG. 2. As the InCeO/Ag/InCeO film was deposited by sputtering the circular cathodes, the sheet resistance and film thickness were not uniformly distributed along the cross-sectional direction. However, the film deposited on a center area of φ6 cm exhibits relative uniform properties, such as the sheet resistance, 5±1.5 ohm/sq, and the thickness, 97.2±5 nm, as shown by the data in FIG. 2 and Table 5.

TABLE 5

The distribution of the film thickness along the cross-sectional direction

|  | Thickness (nm) | | | | |
|---|---|---|---|---|---|
| Distance (cm) | −8 | −4 | 0 | 4 | 8 |
| Bottom InCeO | 35.9 | 46.6 | 48.3 | 42.6 | 32.0 |
| Middle Ag | 10.5 | 12.0 | 12.7 | 11.2 | 8.6 |
| Top InCeO | 35.3 | 39.6 | 41.1 | 38.4 | 33.4 |

Table 6 shows the properties of InCeO/Ag/InCeO films prepared on Arton with different thickness. The sheet resistance is an averaged value measured from an area of φ4 inches. Although it was mentioned that the InCeO/Ag/InCeO film can be deposited on plastics (U.S. Pat. No. 5,667,853 to Fukuyoshi et al.), this is the first time the data from the sample (54-3[#]) show that InCeO/Ag/InCeO films deposited on Arton have a transmittance above 90% and a sheet resistance below 5 ohm/sq. Further analysis indicates that the $O_2$ gas flow and the film thickness are the important factors affecting the sheet resistance and optical transmittance of the InCeO/Ag/InCeO films. Firstly, the increase of the $O_2$ gas flow rate from 0.4 to 1.0 sccm in the deposition of InCeO films induces the increase of the transmittance of the formed InCeO/Ag/InCeO films, as one can see the data measured from samples 54-1, 54-2, and 54-3. Second, as can be seen by comparing sample 53-2 with sample 54-1, it is clear that the decrease of the Ag thickness results in the increase of both transmittance and sheet resistance.

Figure 3:
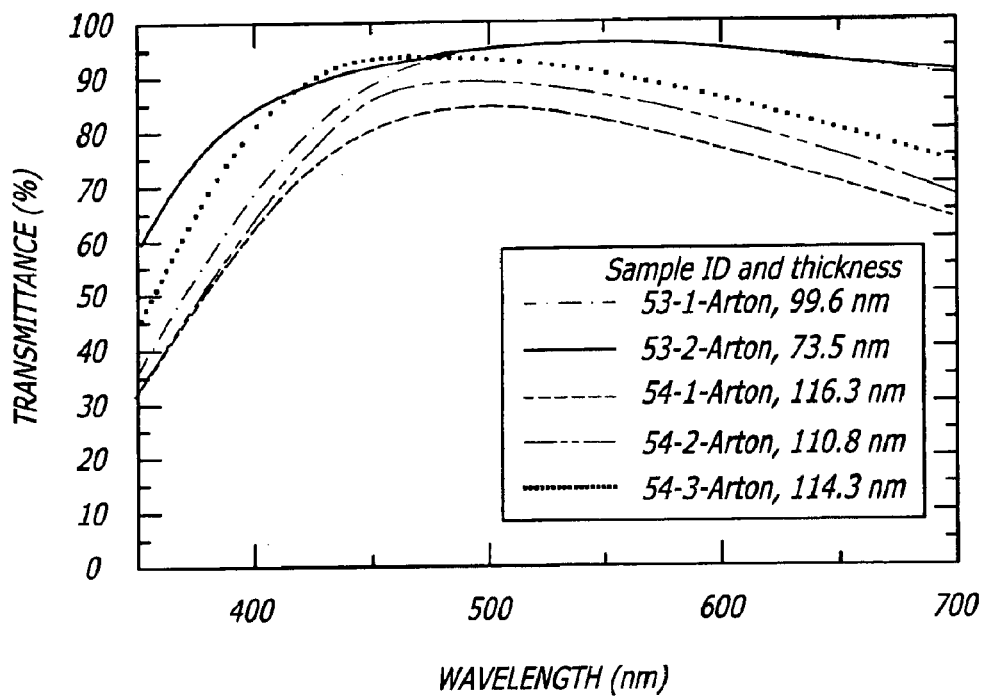
FIG. 3 is a graph showing the transmittance across the visible spectrum of InCeO/Ag/InCeO films deposited on Arton.

FIG. 3 is a plot of transmittance as a function of wavelength across the visible spectrum for InCeO/Ag/InCeO films deposited on Arton. The data in FIG. 3 show that the InCeO/Ag/InCeO films with a thin Ag layer and a minimum total thickness have the highest transmittance (sample 53-2). The increase of $O_2$ gas flow rate in the deposition of InCeO films results in the increase of the transmittance of the InCeO/Ag/InCeO films (see the transmittance curves of samples 54-1, 2, and 3). Data in Table 6 and FIG. 3 indicate that the $O_2$ pressure influences the optical transmittance and the Ag thickness controls the conductivity of the InCeO/Ag/InCeO films.

TABLE 6

Thickness and properties of InCeO/Ag/InCeO films on Arton
InCeO (top)-Ag-InCeO (bottom)

| Sample ID | 53-1 | 53-2 | 54-1 | 54-2 | 54-3 |
|---|---|---|---|---|---|
| Power (W) | 800-50-800 | 800-50-800 | 800-70-800 | 800-70-800 | 800-70-800 |
| $O_2$ (sccm) | 0.6-0-0.6 | 1.0-0-1.0 | 0.4-0-0.4 | 0.6-0-0.6 | 1.0-0-1.0 |
| Thickness (nm) | 45-10.6-45 | 36-8.3-30 | 37-16.7-63 | 38-15.4-57 | 36-15.3-63 |
| T % @ 550 nm | 97.29 | 96.96 | 85.09 | 89.34 | 91.86 |
| Rs (Ω/sq) | 5.8 | 6.6 | 3.44 | 3.56 | 3.31 |

Figure 4:
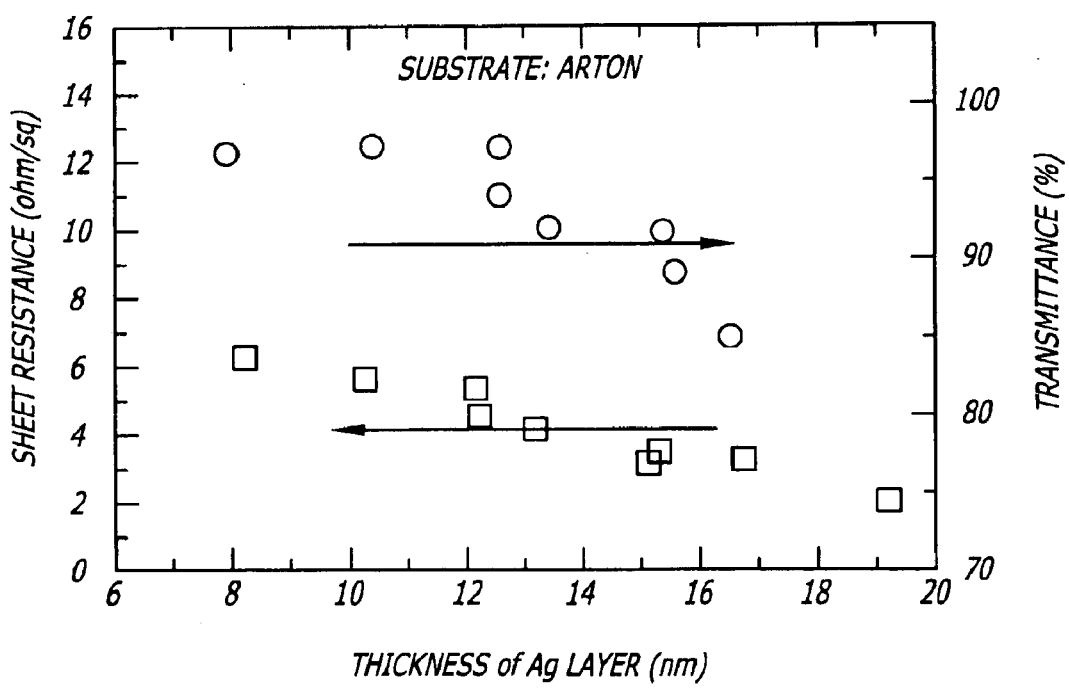
FIG. 4 is a graph showing the Ag layer thickness versus the sheet resistance and optical transmittance for films deposited on Arton.

The influence of the individual film thickness on the properties of InCeO/Ag/InCeO films was studied by deposition of the series films with different thickness of Ag or InCeO layers, respectively. FIG. 4 shows the effect of Ag layer thickness on the sheet resistance and optical transmittance of the InCeO/Ag/InCeO films deposited on Arton; the sheet resistance is depicted by the circles and the optical transmittance in percent is depicted by the squares. Table 7 lists the deposition parameters and the InCeO layer thickness in these samples. The bottom InCeO film has a thickness that is close to that of the top one for each sample. It can be seen that the sheet resistance and the transmittance are continuously decreased with increasing Ag thickness. However, InCeO/Ag/InCeO films with an Ag layer thickness below 16 nm still have a high transmittance above 90% and low sheet resistance below 7 ohm/sq.

TABLE 7

Thickness of InCeO layer and deposition parameters

| Sample ID | 53-2 | 53-1 | 56-1 | 56-3 | 55-1 | 54-3 | 54-2 | 54-1 |
|---|---|---|---|---|---|---|---|---|
| Top InCeO (nm) | 35.3 | 44.5 | 37.2 | 39.6 | 37.7 | 35.6 | 37.9 | 36.6 |
| $O_2$ for InCeO (sccm) | 1.0 | 0.6 | 0.4 | 1.0 | 0.4 | 1.0 | 0.6 | 0.4 |
| Power for Ag (W) | 50 | 50 | 57 | 57 | 65 | 70 | 70 | 70 |

Figure 5:
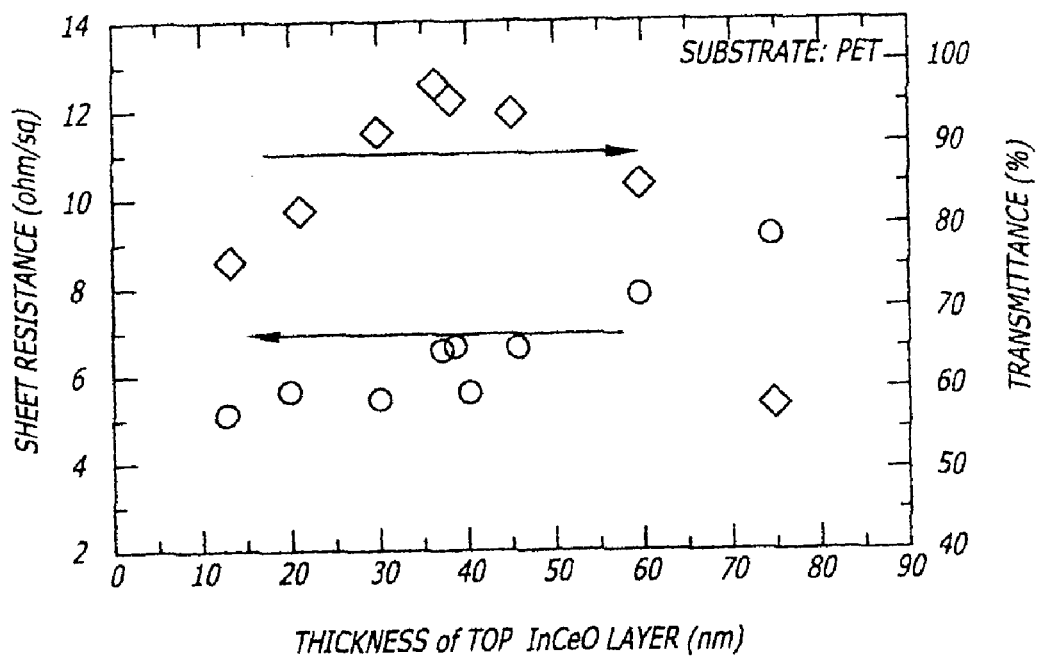
FIG. 5 is a graph showing the InCeO layer thickness versus the sheet resistance and optical transmittance for films deposited on PET.

The influence of the InCeO layer thickness on the sheet resistance and optical transmittance is shown in FIG. 5 and Table 8. FIG. 5 shows the effect of InCeO layer thickness on the sheet resistance and optical transmittance of the InCeO/Ag/InCeO films deposited on Arton; the sheet resistance is depicted by the circles and the optical transmittance in percent is depicted by the squares. The InCeO/Ag/InCeO films were deposited on PET. As the thickness of all Ag layer is almost the same (Table 8), the increase of InCeO thickness in the InCeO/Ag/InCeO structure results in increasing the sheet resistance (see FIG. 5). However, the transmittance exhibits a maximum value around an InCeO thickness of about 40 nm. It seems that an InCeO thickness of about 30–45 nm and an Ag thickness of about 12–16 nm are the optimal combination to form InCeO/Ag/InCeO films on polymers with lower sheet resistance (≦6 ohm/sq) and higher optical transmittance (≧90%).

TABLE 8

Thickness of Ag layer and deposition parameters

| Sample ID | 77-4 | 77-3 | 61-2 | 63-2 | 64-2 | 58-1 | 77-2 | 77-1 |
|---|---|---|---|---|---|---|---|---|
| Ag layer (nm) | 13.6 | 12.7 | 10.1 | 12.1 | 11.8 | 12.7 | 12.1 | 11.9 |
| $O_2$ for InCeO (sccm) | 0.6 | 0.6 | 0.6 | 0.6 | 0.6 | 0.6 | 0.6 | 0.6 |

TABLE 8-continued

Thickness of Ag layer and deposition parameters

| Sample ID | 77-4 | 77-3 | 61-2 | 63-2 | 64-2 | 58-1 | 77-2 | 77-1 |
|---|---|---|---|---|---|---|---|---|
| Power for Ag (W) | 68 | 68 | 65 | 65 | 68 | 55 | 68 | 68 |

The InCeO/Ag/InCeO films were also deposited on Arylite and PEN rolls with a sheet resistance below 5 ohm/sq and an optical transmittance above 90%.

B. Roll-to-Roll Deposition of InCeO/Ag/InCeO Films on Hard Coating

Roll-to-roll deposition of InCeO/Ag/InCeO films on hard coating (HC)/plastic roll is an important step toward the formation of plastic display electrodes. In this Example, the deposition of InCeO/Ag/InCeO films on HC/PET or HC/Arton has been systematically investigated with regarding to the optimization of the properties such as the sheet resistance, transmittance, color, and surface morphology.

The properties of the InCeO/Ag/InCeO films deposited on PET and HC/PET is shown in Table 9. During depositions, the Ar gas flow rate is 10 sccm, and the line speeds for the deposition of InCeO, Ag, and InCeO are 0.65, 0.8, and 0.65 feet/min, respectively. Data in table 9 show that the InCeO/Ag/InCeO films deposited on both PET and HC/PET exhibit the same properties, i.e., a sheet resistance less than 5 ohm/sq and an optical transmittance above 90%. The increase of the $O_2$ gas pressure in depositions results in formation of the films with high transmittance and low sheet resistance.

TABLE 9

Properties of InCeO/Ag/InCeO films on PET and hard coating/PET
InCeO (top)-Ag-InCeO (bottom)

| Sample ID | 61-1 | | 61-2 | | 61-3 | |
|---|---|---|---|---|---|---|
| Power (W) | 600-65-600 | | 600-65-600 | | 600-65-600 | |
| $O_2$ (sccm) | 0.4-0-0.4 | | 0.6-0-0.6 | | 1.0-0-1.0 | |
| Substrate | PET | HC/PET | PET | HC/PET | PET | HC/PET |
| T % (@ 550 nm) | 96.7 | 88.8 | 97.7 | 96.1 | 98.6 | 100 |
| Rs (Ω/sq) | 6.76 | 6.08 | 4.65 | 4.96 | 5.42 | 4.87 |

Table 10 shows influences of the $O_2$ gas flow rate and the film thickness on the color, sheet resistance, and optical transmittance of the InCeO/Ag/InCeO films prepared on HC/Arton and HC/PET, respectively. It is clear that the InCeO/Ag/InCeO films deposited on these substrates exhibit similar properties with regarding to the same deposition parameters. The results indicate that increase of the $O_2$ gas flow rate from 0.4 to 1.6 sccm results in formation of the InCeO/Ag/InCeO films with high brightness (L), high optical transmittance, and low sheet resistance. In addition, the increase of the Ag thickness and the decrease of the InCeO thickness are associated with the reduction of the sheet resistance.

Figure 6:
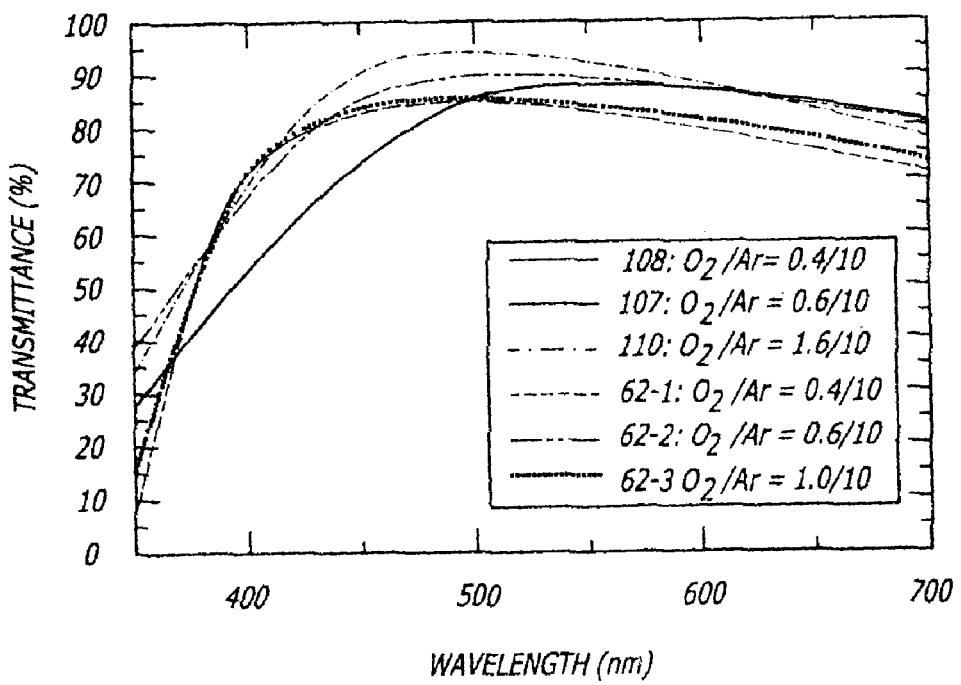
FIG. 6 is a graph showing the optical transmittance across the visible spectrum for InCeO/Ag/InCeO films deposited on HC/Arton and HC/PET.

FIG. 6 shows the transmittance of InCeO/Ag/InCeO films deposited at different $O_2$/Ar gas ratios. Summarizing the data in Tables 3–10 and FIGS. 1–6, it was found that different plastic substrates do not obviously affect the properties of the InCeO/Ag/-InCeO films. The deposition results show that the InCeO/Ag/InCeO films can be commonly prepared to have sheet resistance below 5 Ω/sq and transmittance above 90% regardless of whether the film was deposited on PET, Arton, PET+ hard coating, or Arton+ hard coating. The $O_2$ gas flow rate and the thickness of the Ag and InCeO layers are important factors in influencing the electrical and optical properties of the InCeO/Ag/InCeO films.

C. Interlayer Adhesion of InCeO/Ag/InCeO Films on Plastics

Figure 7:
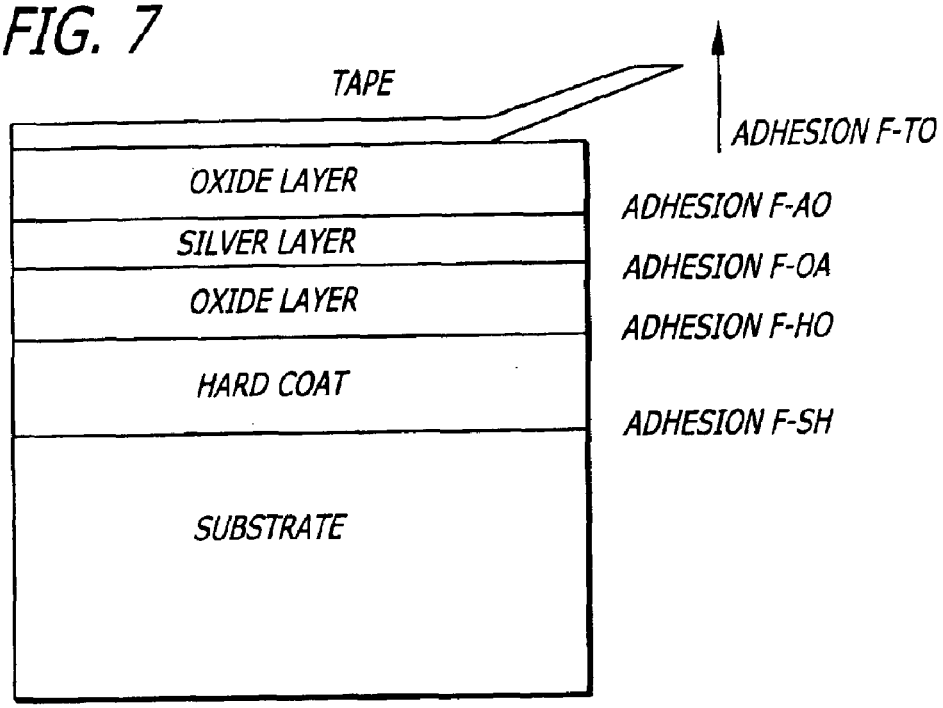
FIG. 7 is a diagram of a simplified model of a test to check interlayer adhesion of the films.

The Interlayer Adhesion Between InCeO and Ag or Between InCeO/Ag/InCeO structure and plastic substrate is an important criterion in evaluation on the performance of the formed display electrodes. As depicted by the interlayer adhesion test (IAT) model shown in FIG. 7, if any interlayer adhesion F—AO, F—OA, F—HO or F—SH is lower than the adhesion between the tape and the top oxide F—TO, the corresponding interface will fail in a peel test. The focus of the IAT is not to measure the average peel force that may mainly depends on the adhesion between the tape and the top oxide layer, but to determine whether or not the film is damaged by the peel test. If IAT is performed at the same average peel force, some films are damaged while others are not, the latter is assumed to have a better interlayer adhesion than the former. In the IATs, 3M tape 810 is used to detect the failure at relatively low peel force while 3M tape 600 is used to detect that at a higher peel force.

In this Example, the interlayer adhesion of the InCeO/Ag/InCeO films was extensively investigated with regarding to the deposition conditions, plastic substrates, and post-processes (annealing and aging). The analyses and discussion on the IAT results were directed to enhance the formation of the films with optimal performances.

Effects of Ar+$O_2$ Plasma Pre-Purging

Prior to film deposition, the surface of the plastic roll was purged by Ar+$O_2$ plasma. As the plastic roll moves with a high line-speed of 3.5 feet/min, Ar+$O_2$ plasma formed at a pressure greater than 10 mT cannot deposit the films with a thickness above 5 nm. However, this preliminary plasma treatment can clean the plastic surface, modify the chemical composition, and activate the surface bonding. Especially, plasma purging, with the Ar$^+$ and O$^+$ ions, will introduce new types of oxygen bonds on plastic surface, which could enhance the formation of the oxide films with a good adhesion (B. Drevillon et al, Thin Solid Films 236, (1993) 204; S. Vallon et al, J. Elec. Spec. Related Phen. 64/65, (1993), 849). It was found that Ar+$O_2$ plasma formed at the sputtering power of 1–1.2 kW and the $O_2$/Ar gas flow ratio of 4/40–5/50 sccm had a good surface purging effect. The typical instance was that the InCeO/Ag/InCeO films depos-

TABLE 10

Properties of InCeO/Ag/InCeO films on HC/PET and HC/Arton
InCeO (top) - Ag - InCeO (bottom)

| ID | | Thickness | $O_2$ | Color | | | T % | Rs |
|---|---|---|---|---|---|---|---|---|
| Subs. | No | (nm) | (sccm) | L | a | b | @ 550 nm | (Ω/sq) |
| HC/Arton | 108 | 43.2-15.0-48.3 | 0.4-0-0.4 | 79.3 | −5.37 | 4.16 | 93.8 | 5.96 |
| HC/Arton | 107 | 39.8-14.9-41.6 | 0.6-0-0.6 | 80.1 | −5.17 | 4.58 | 94.5 | 5.36 |
| HC/Arton | 110 | 40.6-15.6-41.4 | 1.6-0-1.6 | 81.7 | −5.35 | −1.02 | 96.1 | 4.62 |
| HC/PET | 62-1 | 38.6-12.1-34.5 | 0.4-0-0.4 | 82.1 | −5.43 | −0.55 | 88.7 | 6.3 |
| HC/PET | 62-2 | 37.1-11.9-33.7 | 0.6-0-0.6 | 83.0 | −5.61 | 1.05 | 90.6 | 5.67 |
| HC/PET | 62-3 | 35.8-11.8-32.9 | 1.0-0-1.0 | 83.0 | −6.04 | 0.57 | 90.1 | 4.56 | ited on the plasma purged Arton passed the IATs with the tape 810, while the film deposited on Arton failed in the IATs.

Effects of Plastic Substrate

The InCeO/Ag/InCeO films were prepared on different plastics that are in Table 1. The results of IATs measured from these samples are summarized in Table 11.

TABLE 11

Interlayer adhesion of films on different substrates

| Substrate | | Average peel force (g) | | | |
|---|---|---|---|---|---|
| Materials | Tg (° C.) | Tape 810 | Tape 600 | IAT With Tape 810 | IAT With Tape 600 |
| Arylite | 330 | 550–620 | 900–1000 | Samples fail to pass the IAT or in critical situation | All samples fail to pass the IAT |
| Arton | 171 | 700–850 | 1000–1200 | Most samples fail to pass the IAT. | All samples fail to pass the IAT. |
| PEN | 120 | 850–920 | 1100–1250 | All samples pass IAT. | Some samples are in critical situation. The rest are fail. |
| PET | 78 | 750–860 | 1100–1200 | Most samples pass IAT. | Some samples are in critical situation. The rest are fail. |

The data in Table 11 show that the InCeO/Ag/InCeO films deposited on PEN and PET have better interlayer adhesion than the films on Arton and Arylite. Usually, the adhesive strength of thin films highly depends on the surface composition, bonding structure, and surface roughness of the substrate materials. Especially, the materials with high surface energy tend to bond a surface film firmly to reduce its surface energy, which results in a good interfacial adhesion. The data in Table 1 show that PEN and PET have surface energies (43.3–43.9 mN/M) higher than those of Arton (38.9 mN/M) and Arylite (40.7 mN/M), which may result in the differences on the interlayer adhesion of the films on these plastics.

On the other hand, it is clear that the InCeO/Ag/InCeO films deposited on low Tg plastics (PEN and PET) have better adhesion than the films on high Tg plastics (Arylite and Arton), as the data show in Table 11. It can be expected that the mismatch in bonding structure or thermal expansion between two materials cause the stress in the interfacial area, resulting in defects, cracking, and poor adhesion. Usually, polymers have a thermal expansion coefficient higher than that of the oxide films (S. K. Park et al., Thin Solid Films 397, (2001) 49). However, in comparison with high Tg plastics, low Tg polymers, such as PEN and PET, are easy to release the stress through slight plastic deformation during the deposition process and promotes the film formed with an enhanced interlayer adhesion. It seems that high surface energy and low Tg are helpful to promote the good adhesion of the InCeO/Ag/InCeO films to the plastics.

In addition, it was found that the substrate roughness had no serious influence on the interlayer adhesion. As the results for surface roughness in Table 1 and the results for interlayer adhesion in Table 11 show, it can be seen that the Arton with a low RMS of 3.7 nm has poor adhesion while the PET with a relative high RMS of 5.7 nm still has good adhesion.

Adhesion Enhancement from the Hard Coating

The interlayer adhesion of the films deposited on HC/Arton and HC/PET has been evaluated with comparison of the adhesion of the films directly deposited on Arton or PET plastics. The results from IATs are shown in Table 12.

TABLE 12

Interlayer adhesion of films on plastics or on HC/plastics

| Substrate materials | Tape 810 | Tape 600 | Film Morphology | IAT (Tape 810) | IAT (Tape 600) |
|---|---|---|---|---|---|
| Arton | 700–850 | 1000–1200 | Small peaks, many branch and dripping traces | Most samples fail to pass the IAT, others are in critical situation | All samples fail to pass the IAT. |
| HC/Arton | 60–820 | 1000–1150 | Few small peaks, few dripping traces and small pits | Most samples pass IAT, others are in critical situation. | No sample passes IAT. Some are in critical situation. |
| PET | 750–860 | 1100–1200 | Small peaks, very few small flakes | Most samples pass IAT. | No sample passes IAT. |
| HC/PET | 750–850 | 1100–1200 | Rarely distributed small peaks, very few small flakes | Most samples pass IAT. | No sample passes IAT. Some are in critical situation. |

The results indicate that InCeO/Ag/InCeO films deposited on HC/plastics have an enhanced adhesion, as the films synthesized on Arton fail to pass IATs, while the films formed on HC/Arton under the same deposition process successfully pass the IATs with tape 810. In addition, surface quality of the films on HC/Arton or HC/PET is much better than that of the films on Arton or PET. The adhesion enhancement may result from the hard coating whose amorphous structure hybridized with oxygen bonding is easy matched with the amorphous InCeO bonding structure. In addition, amorphous hard coating has no definite thermal expansion coefficient and works as a buffer layer to release the thermal stress, which enhances the interfacial adhesion of the InCeO/Ag/InCeO films to plastics. The effect of oxygen flow in depositions on the interlayer adhesion Since the $O_2$ flow can sensitively influence the transmittance and conductivity of the InCeO/Ag/InCeO films, IATs have been continued to investigate the interlayer adhesions on these samples. Table 13 shows the IAT results obtained from the InCeO/Ag/InCeO films whose InCeO layers were synthesized at the $O_2$ flow rates of 0–2 sccm and an Ar flow rate of 10 sccm. The substrate is HC/Arton.

interfacial adhesion. Therefore the interfacial adhesion of the etched and cleaned samples has been investigated. Tables 14 and 15 show the IAT data measured from the as-deposited and cleaned InCeO/Ag/InCeO films.

TABLE 14

Comparison of peel force with or w/o cleaning

| InCeO/Ag/InCeO films | Average peel force (g) | |
|---|---|---|
| | no cleaning | after cleaning |
| 101-HC | 776.33 | 819.57 |
| 101-HC-annealing | 706.76 | 742.36 |
| 103-Arton | 710.12 | 852.92 |
| 103-HC | 698.50 | 765.10 |
| 103-HC-annealing | 576.20 | 625.16 |
| 105-HC-annealing | 606.39 | 646.78 |

TABLE 13

IAT results of the InCeO/Ag/InCeO films whose InCeO layer prepared under different oxygen flow-rates in the deposition.

| Sample Condition | Average peel force (g) | | Film Morphology | IAT (Tape 810) | IAT-annel. (Tape 810) |
|---|---|---|---|---|---|
| | Tape 810 | Annealed Tape 810 | | | |
| $O_2$: 0~0.2 sccm | 600~750 | 600~750 | few small peaks, few dripping traces | Most samples pass IAT. | All samples pass IAT |
| $O_2$: 0.4~1 sccm | 600~750 | 600~750 | Same as above. | Same as above. | Same as above |
| $O_2$: >1 Sccm | 600~750 | 600~750 | Same as above. | Most samples fail to pass. | Same as above |

Variation of $O_2$ flow rate in deposition does not obviously affect the surface morphology, but influences the interlayer adhesion of the InCeO/Ag/InCeO films formed on HC/Arton. IAT results indicate that there is no observable damage on the films deposited at an $O_2$ flow rate below 1 sccm. However, increasing $O_2$ flow rate above 1 sccm results in formation of the films that have some scratch flakes on the surface after IATs. The scratch flake does not come from the peel test but from the cleaning process that is followed to the peel test. The film deposited on Arton under different $O_2$ flow rates has similar tendency as the film on HC/Arton. The differences in interfacial adhesion from the samples formed at different $O_2$ flow rates disappeared if the samples were annealed at 140° C. for two hours. Surface observation indicated that the damage mode of samples with high $O_2$ flow rate was correlated with the residual stress in the films, as the flakes often occurred on the peeled surfaces after IATs. As the annealing process may release the stress so it enhances the interfacial adhesion. To our best knowledge, the effect of $O_2$ flow on interlayer adhesion has not been reported so far and its exploration needs more work in further.

Effect of Etching and Cleaning Treatment

Figure 8:
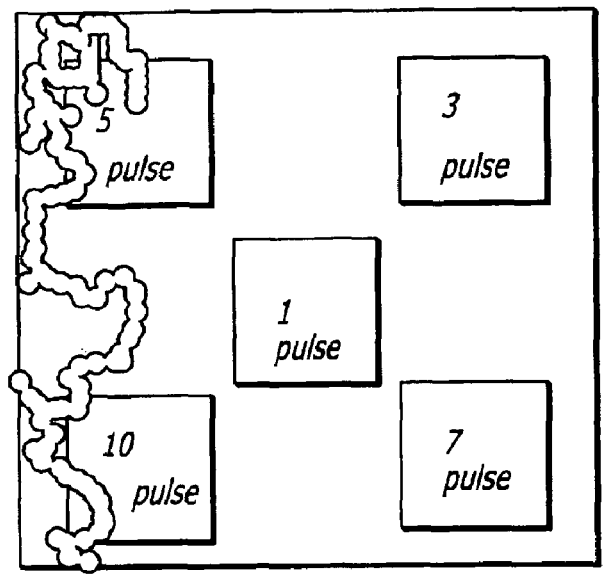
FIG. 8 is a drawing showing damage of a laser-etched sample after the peel test, showing damage in the areas etched with 5 or 10 pulses.

The InCeO/Ag/InCeO films must be wet or dry etched and chemically cleaned to form the display electrodes. The etched films should keep the good structure stability and It can be seen that the average peel force is increased after surface cleaning. The low peel force may result from the poor adhesion of the tape to the film surface where the contamination occurred. It was also found that the InCeO/Ag/InCeO films synthesized on HC/Arton with low $O_2$ flow-rates (<1 sccm) in InCeO deposition exhibited no observable damage after cleaning and passed the IAT with tape 810. However, if the films were not uniformly deposited on the plastic sheet whose size is 10×10 inches, the damages were formed on the edge area of the wet etched and laser etched samples even after cleaning, as in the case demonstrated in FIG. 8. FIG. 8 shows a laser-etched sample (320 MJ/cm$^2$); areas etched with 5 and 10 pulses and yellow area have been damaged. Since the film on the edge area has the thickness and chemical composition different from the center area, it is easy to be damaged no matter if etched. On the other hand, there is no damage on the center area of the laser (pulses 1, 3 and 7) etched samples as the film has the uniform thickness and composition there. Usually, the film on the sample edges has a worse interlayer adhesion than that in the middle area of the samples.

TABLE 15

The surface situation of cleaned samples

| Sample | Substrate | Original morphology | Surface observation After cleaning | After peel test with tape 810 |
|---|---|---|---|---|
| 101 | HC/Arton | Rarely Distributed small peaks, few dripping traces | Flakes • | Flakes • |
| 101 140° C.- 2 hr. | HC/Arton | Rarely Distributed small peaks, few dripping traces | No observable damage ○ | Very small flakes |
| 103 | HC/Arton | Rarely Distributed small peaks, few dripping traces | No observable damage ○ | No observable damage ○ |
| 103 140° C.- 2 hr. | HC/Arton | Rarely Distributed small peaks, few dripping traces | No observable damage ○ | No observable damage○ |
| 105 140° C.- 2 hr. | HC/Arton | Rarely Distributed small peaks, few dripping traces | No observable damage ○ | No observable damage ○ |

○ Passed
Critical
• Damaged

As the cross-hatched peel test can measure the interlayer adhesion under situations where the film has been damaged (such as cracks, flakes and etched grooves), it was specially used to evaluate the interlayer adhesion of the etched InCeO/Ag/InCeO samples, ITO films, and other Ag based films, comparatively. It was found that there was no observable damage along the cut lines on all InCeO/Ag/InCeO samples after the cross-hatched peel test. The InCeO/Ag/InCeO film had a better toughness but softer as compared with ITO films. The results also showed that the cross-hatched peel test induced the delamination of TM-EMI Ag film, but had no influence on 3M Ag film whose adhesion is similar to InCeO/Ag/InCeO films. After cross-hatched peel test, the InCeO/Ag/InCeO films were immersed in IPA for 6 hours, wiped with papers, and then checked under the optic microscope. No observable damages have been found on these samples.

D. Post-annealing and Post-aging Treatment

Usually, the InCeO layer in InCeO/Ag/InCeO films was amorphous in structure when it was deposited at room temperature (U.S. Pat. No. 5,667,853 to Fukuyoshi et al.) It was said that the InCeO/Ag/InCeO film was post-annealed at 220–270° C. for 0.5–1 hour to reduce the sheet resistance (U.S. Pat. No. 5,667,853 to Fukuyoshi et al.). However, the influence of the post-annealing on the morphology, interlayer adhesion, and structure stability of the InCeO/Ag/InCeO films has not been reported yet. In this Example, the annealing was designed and performed at temperatures of 75–225° C. for times of 30–120 min, to investigate the influence of the annealing on the properties, morphology, and interlayer adhesion of the InCeO/Ag/InCeO films. Because the Tg temperature of Arton, PET and PEN is below 170° C., most annealing treatment was actually carried out at a temperature around 150° C.

The deposited and annealed InCeO/Ag/InCeO films were then aging treated at 60° C. and 90% RH for 500 hours to investigate the stability on the properties and structure of the films. The InCeO/Ag/InCeO films used for annealing and aging studies were prepared on HC/Arton and the gas ratios of $O_2$:Ar were changed as 0:10, 0.4:10; 0.6:10, 1:10, 1.6:10, and 2.0:10 sccm, in the deposition of InCeO layers. Other conditions, such as the sputter powers of 600–70–600 W, the line speeds of 0.7–0.8–0.7 feet/min, and the deposition distance of 10 inches, were kept the same in all depositions.

Surface Morphology and Smoothness

Figure 9:
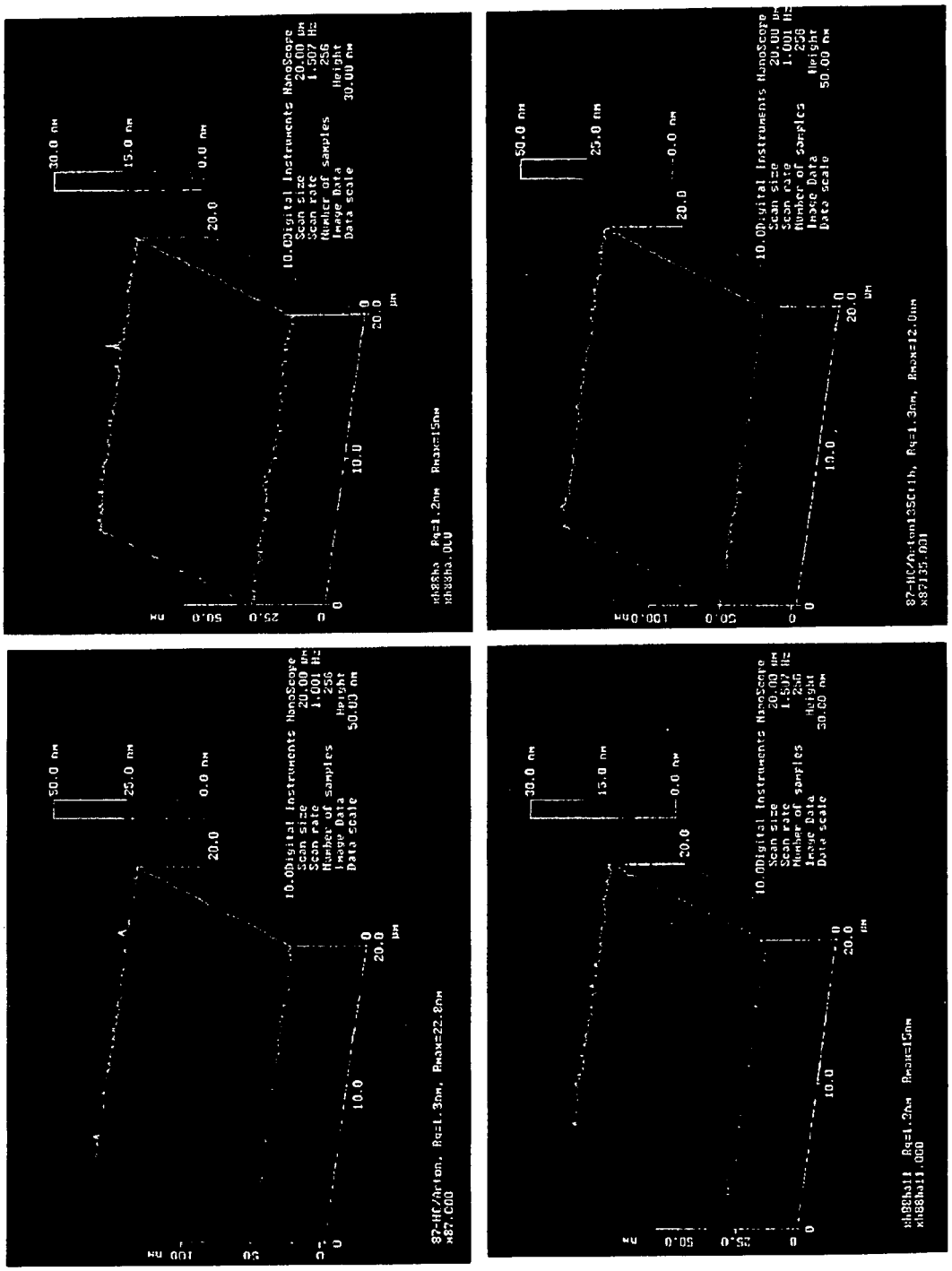
FIG. 9 is diagrams showing results from AFM to show surface morphology of as-deposited, annealed, aged, and annealed and aged InCeO/Ag/InCeO films deposited on HC/Arton: (a) as-deposited; (b) annealed; (c) annealed; and (d) annealed and aged.

The surface morphology and smoothness were observed and evaluated with AFM and optical microscopy. FIG. 9 shows the AFM pictures on the typical surface morphologies of the as-deposited, annealed and aged InCeO/Ag/InCeO films deposited on HC/Arton: (a) as-deposited 88#; (b) annealed 88#; (c) aged 87#; and (d) annealed and then aged 87#.

Table 16 show the root-mean-square (RMS) surface roughness of samples 85#–91# measured by AFM. The samples are the as-deposited, annealed and aged InCeO/Ag/InCeO films. It can be seen that the RMS roughness from the deposited and annealed samples is very close in values to that of the aged samples, as indicated by the data shown in Table 15. These RMS values varied just from 1 to 1.5 nm and a RMS value of 1.3 nm seems a stable roughness for most samples. It seems that both annealing and long time aging have no obvious influence on the surface smoothness of InCeO/Ag/InCeO films. The high RMS values of 1.9–2.5 nm in Table 15 are associated with the contaminated materials that existed as the peaks on the sample surface (see FIGS. 9 and 10). It was observed that the surface smoothness of the InCeO/Ag/InCeO films is very sensitive to the environmental contamination.

TABLE 16

RMS roughness of InCeO/Ag/InCeO films

| Sample ID | 91 # | 85 # | 89 # | 87 # | 90 # | 88 # | 86 # |
|---|---|---|---|---|---|---|---|
| $O_2$ flow rate (sccm) | 0 | 0.2 | 0.4 | 0.6 | 0.8 | 1.0 | 1.2 |
| RMS (nm) (As-deposited) | 1.2 | 1.4 | 1.1 | 2.5 | 1.3 | 1.2 | 1.9 |
| RMS (nm) (Annealed) | 1.3 | 1.3 | 1.3 | 1.2 | 1.0 | 1.3 | 1.3 |
| RMS (nm) (Aged) | 1.5 | 1.3 | 1.3 | 1.3 | 1.3 | 1.3 | — |
| RMS (nm) (annealed & aged) | 2.1 | 1.7 | 2.0 | 1.3 | 1.7 | 1.3 | 1.3 |

Figure 10:
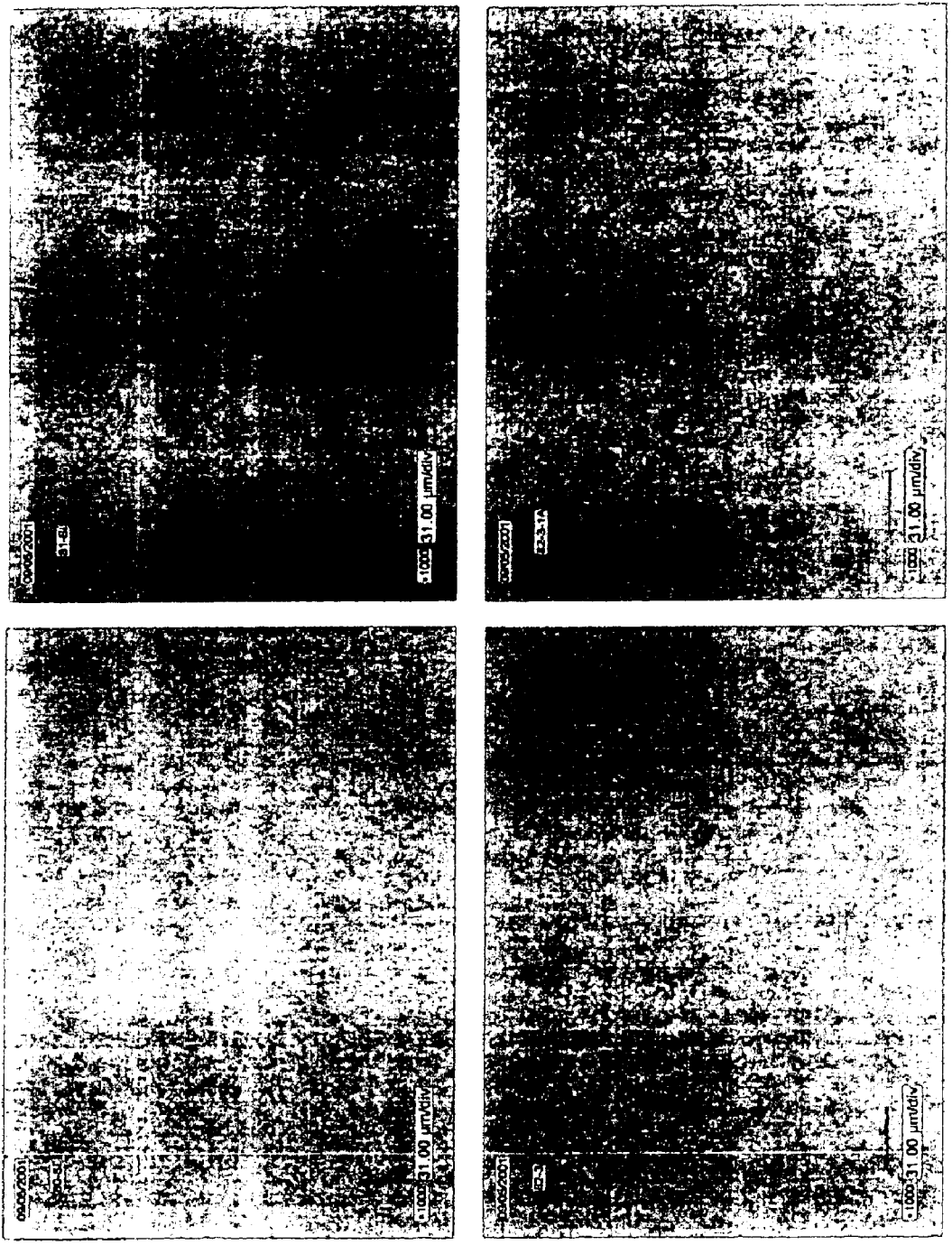
FIG. 10 is optical photomicrographs of InCeO/Ag/InCeO films showing surface morphology: (a) as deposited on Si; (b) annealed on Si; (c) as deposited on HC/Arton; and (d) annealed on HC/Arton.

FIG. 10 shows the typical surface morphology measured with an optical microscope at a magnification of ×1000 of InCeO/Ag/InCeO films; (a) as-deposited sample 80# on Si; (b) annealed sample 80# on Si; (c) as-deposited sample 82-3 on HC/Arton; and (d) annealed sample 82-3 on HC/Arton. The InCeO/Ag/InCeO films deposited on silicon wafer and HC/Arton and then annealed in air at a temperature of 145° C. for one hour. It can be seen that there are always some small peaks and pits on the surface of the as-deposited films (FIGS. 10(a) and (c)). However, after annealing treatment, the InCeO/Ag/InCeO films on all different substrates become more smooth and flat. Most peaks on the surface are flattened and the small peaks disappeared (see FIGS. 10(b) and (d)). The observation indicates that post-annealing improves the surface quality of InCeO/Ag/InCeO films deposited on different materials. The annealing with long time is more helpful to flat the surface and improve the smoothness of InCeO/Ag/InCeO films.

Interlayer Adhesion and Properties

Data in Table 17 show that the increase of the $O_2$ flow rate results in formation of the InCeO/Ag/InCeO films with reduced sheet resistance, increased transmittance and brightness (L). In addition, the InCeO/Ag/InCeO films deposited at low oxygen flow-rate can pass IAT, as the data shown in table 1.

XPS results indicated that the annealing process induced the changes of the chemical composition of the InCeO layers, which may cause the changes of the film properties, as the data shown in Table 18. In addition, the annealing flattens the film surface and improves the surface smoothness (Table 16, FIGS. 9 & 10), and results in the decrease of sheet resistance and the increase of both transmittance and brightness of the InCeO/Ag/InCeO films (J. Szczyrbowski et al., "New low emissivity coating based on TwinMag® sputtered $TiO_2$ and $Si_3N_4$ layers", Thin Solid Films 351, (1999) 254.) However, variations of the composition and morphology have no influence on the interfacial adhesion of the InCeO/Ag/InCeO films as all annealed films formed with $O_2$ flow rates of 0–2 sccm pass the IATs (see the data in Table 18). One possible reason for the adhesion improvement is the release of the residual stress by annealing, as the heating at 145° C. for one or two hours can eliminate some micro-defects in the film and interfacial area and then reduces the residual stress there. These changes stabilize the film structure and improve the interlayer adhesions.

TABLE 17

Properties of InCeO/Ag/InCeO films on HC/Arton
InCeO (top)-Ag-InCeO (bottom)

| ID | $O_2$ (sccm) | Thickness (nm) | IAT (tape 810) | L | Color a | b | T % @ 550 nm | Rs (Ω/sq) |
|---|---|---|---|---|---|---|---|---|
| 99 | 0.0-0-0.0 | 43.4 15.3 49.1 | Pass | 76.4 | −6.17 | 4.67 | 90.55 | 7.36 |
| 95 | 0.4-0-0.4 | 51.4 13.8 49.6 | Pass | 79.1 | −5.48 | 4.22 | 93.34 | 7.46 |
| 96 | 1.0-0-1.0 | 42.0 15.4 47.3 | Critical | 80.5 | −4.46 | 0.87 | 94.40 | 6.03 |
| 98 | 1.6-0-1.6 | 40.8 15.9 45.5 | Fail | 80.6 | −5.33 | −0.11 | 95.54 | 4.95 |
| 101 | 2.0-0-2.0 | 35.1 15.9 39.5 | Fail | 80.4 | −5.89 | −0.96 | 94.62 | 4.35 |

In contrast, the InCeO/Ag/InCeO films annealed at 140° C. for two hours exhibit an enhanced adhesion to the HC/Arton substrate. Data in Table 18 show that almost all samples passed the adhesion test using tape 810, in spite of the variation of the $O_2$ flow-rate (0–2 sccm). Comparing the data in Tables 17 and 18, it is also found that two-hour annealing induces reduction of the sheet resistance and increase of the transmittance, especially as the film formed at low $O_2$ flow-rate. The brightness of the annealed films increases at least about 1% as compared with the as-deposited films formed under the same deposition conditions (see the data in Tables 17 and 18).

TABLE 18

Properties of annealed InCeO/Ag/InCeO films on HC/Arton
InCeO (top)-Ag-InCeO (bottom)

| ID | $O_2$ (sccm) | Thickness (nm) | IAT (tape 810) | L | Color a | b | T % @ 550 nm | Rs (Ω/sq) |
|---|---|---|---|---|---|---|---|---|
| 99 | 0.0-0-0.0 | 43.4 15.3 49.1 | Pass | 78.2 | −6.89 | 4.38 | 92.08 | 6.95 |
| 95 | 0.4-0-0.4 | 51.4 13.8 49.6 | Pass | 80.4 | 7.00 | 7.62 | 94.48 | 6.50 |
| 96 | 1.0-0-1.0 | 42.0 15.4 47.3 | Pass | 81.5 | −6.42 | 2.34 | 95.08 | 4.72 |
| 98 | 1.6-0-1.6 | 40.8 15.9 45.5 | Pass | 81.5 | −6.46 | 1.78 | 96.63 | 4.00 |
| 101 | 2.0-0-2.0 | 35.1 15.9 39.5 | Pass | 81.7 | −5.98 | 0.32 | 95.22 | 3.90 |

TABLE 19

Properties of InCeO/Ag/InCeO films on HC/Arton
InCeO (top)-Ag-InCeO (bottom)

| ID | Status | RMS (nm) | IAT (type 810) | Peel force (g) | Color L | a | b | T % @ 550 nm | Rs (Ω/sq) |
|---|---|---|---|---|---|---|---|---|---|
| 89 | As-deposited | 1.1 | Fail | 768.16 | 80.6 | −5.36 | 2.62 | 95.47 | 6.57 |
| 89 | Annealed | 1.3 | Pass | 773.67 | 81.6 | −5.56 | 1.78 | 95.82 | 6.33 |
| 89 | Aged | 1.3 | Pass | 688.40 | 80.6 | −5.95 | 2.70 | 95.92 | 6.57 |
| 89 | Annealed & Aged | 1.3 | Critical | 717.88 | 81.7 | −5.98 | 3.12 | 97.01 | 6.81 |

Table 19 shows the properties measured from the as-deposited, annealed, aged, and annealed and aged InCeO/Ag/InCeO samples, respectively. The InCeO/Ag/InCeO film was prepared at an $O_2$/Ar gas flow ratio of 0.4/10 sccm. It can be seen that the annealing obviously improves the brightness and enhances the interlayer adhesion of the InCeO/Ag/InCeO films. It was found that after aging treatment, the films deposited at an oxygen flow rate below 0.4 sccm had the better adhesion than the annealed films and the films formed at high oxygen gas flow rates. It seems that aging has no influence on the annealed films or the films prepared at $O_2$ flow rate above 0.6 sccm.

It is expected that the InCeO/Ag/InCeO film may absorb the gas and moisture from aging atmosphere as the aging processed at 60° C. and 90% RH for 500 hours. The absorption results in reduction of the adhesion, which may explain why InCeO/Ag/InCeO films after aging treatment have a reduced peel force, as the data shown in Table 19. It was found that due to the aging the stains formed around a contaminated spot on the film surface. Energy dispersive spectrometer (EDS) analysis indicated that there were some other elements existed in the stains, which suggested the formation of the stains on the contaminated area. In peel tests, these stains became a source of flakes. Usually the films whose surface was contaminated in the annealing exhibited a worse interfacial adhesion after aging treatment. Otherwise, annealing may not have negative effect on aged samples. Therefore, the clean surface is important to maintain the good adhesion and stable structure of the aged films.

Surface Evaluation of Aged Films

Table 20 shows the surface information observed from the aged InCeO/Ag/InCeO films. The films deposited on HC/Arton with an $O_2$ flow rate below 1.0 sccm exhibit excellent structure stability as there are no defect or stains formed on the surface and edges of the samples even when they were aged at 60° C. and 90% RH for 500 hours. It was found that the films synthesized with an $O_2$ flow rate above 1.0 sccm tended to form stains during the aging process.

TABLE 20

Surface situation of aged InCeO/Ag/InCeO films

| Sample ID | $O_2$ flow rate (sccm) | As-deposited | Annealed |
|---|---|---|---|
| 99-HC/Arton | 0 | No defects | Few stains on surface* |
| 95-HC/Arton | 0.4 | No defects | No defects |
| 102-HC/Arton | 0.6 | Same as above | Large stains* |
| 96-HC/Arton | 1.0 | Same as above | No stains |
| 98-HC/Arton | 1.6 | No defects | Few fine stains |
| 101-HC/Arton | 2.0 | Few fine stains | Stains on surface |

*Samples dropped on the water floor during the aging.

The InCeO/Ag/InCeO samples after laser etching were also aged at 60° C. and 90% RH for 500 hours. A laser-etched sample after aging and cleaning treatments was observed under the optical microscope. The results showed that it seemed to have some oxidation along the etched grooves, and the oxidation became obvious with the increase of the laser pulse. After cleaning with IPA, damages along the grooves were formed on samples etched with high laser pulses. However, the InCeO/Ag/InCeO films etched by laser with low pulses of 1, 3, and 7 had good structure stability. As shown in FIG. 8, no damage occurred on these etched areas after aging and cleaning treatments.

We claim:

1. A method for forming a light-transmissive composite film comprising:
   (a) providing a flexible plastic substrate;
   (b) depositing a multi-layered conductive metallic film continuously on the flexible plastic substrate by a thin-film deposition technique; and
   (c) collecting the composite film in continuous rolls, wherein the composite film is light-transmissive in the visible region.

2. The method of claim 1 wherein the thin-film deposition technique is selected from the group consisting of DC magnetron sputtering, ion beam deposition, RF magnetron sputtering, chemical vapor deposition, ion beam enhanced deposition, and laser ablation deposition.

3. The method of claim 2 wherein the thin-film deposition technique is DC magnetron sputtering.

4. The method of claim 2 wherein the thin-film deposition technique is ion beam deposition.

5. The method of claim 2 wherein the thin-film deposition technique is chemical vapor deposition.

6. The method of claim 2 wherein the thin-film deposition technique is ion beam enhanced deposition.

7. The method of claim 2 wherein the thin-film deposition technique is laser ablation deposition.

8. The method of claim 3 wherein the DC magnetron sputtering is performed at a maximum sputter power of from about 300 watts to about 2000 watts.

9. The method of claim 8 wherein the DC magnetron sputtering is performed at a sputter power sequence of from about 500 watts to about 800 watts, followed by from about 50 watts to about 100 watts, followed by from about 500 watts to about 800 watts.

10. The method of claim 9 wherein the DC magnetron sputtering is performed at a sputter power sequence of about 600 watts, followed by about 70 watts, followed by about 600 watts.

11. The method of claim 3 wherein the deposition distance for DC magnetron sputtering is from about 2 inches to about 12 inches.

12. The method of claim 11 wherein the deposition distance for DC magnetron sputtering is from about 9 inches to about 11 inches.

13. The method of claim 3 wherein the DC magnetron sputtering is performed in an atmosphere that contains argon, and, optionally, oxygen.

14. The method of claim 13 wherein the atmosphere contains oxygen in the deposition of InCeO films.

15. The method of claim 14 wherein the flow rate of oxygen is from about 0.2 to about 2.0 standard cubic centimillitor.

16. The method of claim 15 wherein the flow rate of oxygen is from about 0.2 to about 1.0 standard cubic centimillitor.

17. The method of claim 16 wherein the flow rate of oxygen is from about 0.2 to about 0.6 standard cubic centimillitor.

18. The method of claim 14 wherein the flow rate of argon is from about 5.0 to about 20.0 standard cubic centimillitor.

19. The method of claim 18 wherein the flow rate of argon is about 10.0 standard cubic centimillitor.

20. The method of claim 3 wherein line speed during deposition is from about 0.6 to about 4 feet/mm.

21. The method of claim 20 wherein the line speed during deposition is about 0.6 to 1.2 feet/mm.

22. The method of claim 20 wherein the thin conductive metallic film is an InCeO/Ag/InCeO metallic film and the line speed during deposition is about 0.7 feet/mm during deposition of the InCeO layers and is about 0.8 feet/mm during deposition of the Ag layers.

23. The method of claim 3 further comprising the step of purging the surface of the flexible plastic substrate prior to film deposition, to enhance the adhesion of the film to the substrate.

24. The method of claim 23 wherein the step of purging the surface of the flexible plastic substrate prior to film deposition is performed with a plasma selected from the group consisting of the group of Ar+O.sub.2, Ar, and Ar+N.sub.2.

25. The method of claim 24 wherein the step of purging the surface of the flexible plastic substrate prior to film deposition is performed with a Ar+O.sub.2 plasma.

26. The method of claim 1 wherein the thin conductive metallic film is an InCeO/Ag/InCeO film.

27. The method of claim 26 wherein the thickness of the InCeO layers is from about 30 nm to about 60 nm and the thickness of the Ag layer is from about 7 nm to about 20 nm.

28. The method of claim 27 wherein the thickness of the InCeO layers is from about 30 nm to about 45 nm and the thickness of the Ag layer is from about 12 nm to about 16 nm.

29. The method of claim 26 wherein the Ag of the InCeO/Ag/InCeO film is doped with about 1 atom percent of Au and about 0.5 atom percent of Cu to enhance the stability of the silver atoms in the silver layer.

30. The method of claim 1 wherein the thin conductive metallic film is selected from the group consisting of silver, gold, and their alloys.

31. The method of claim 1 wherein the flexible plastic substrate is selected from the group consisting of polyethylene terephthalate (PET), polyethylene naphthalate (PEN), polyethersulfone (PES), polycarbonate (PC), polysulfone, a phenolic resin, an epoxy resin, polyester, polyimide, polyetherester, polyetheramide, cellulose acetate, aliphatic polyurethanes, polyacrylonitrile, polytetrafluoroethylenes, polyvinylidene fluorides, poly(methyl .alpha.-methacrylates) and an aliphatic or cyclic polyolefin.

32. The method of claim 31 wherein the flexible plastic substrate is a cyclic polyolefin.

33. The method of claim 32 wherein the cyclic polyolefin is poly(bis(cyclopentadiene)).

34. The method of claim 33 wherein the flexible plastic substrate is a polyester.

35. The method of claim 34 wherein the polyester is an aromatic polyester.

36. The method of claim 31 wherein the flexible plastic substrate is reinforced with a hard coating.

37. The method of claim 36 wherein the hard coating is an acrylic coating.

38. The method of claim 37 wherein the hard coating improved the adhesion and smoothness of the InCeO/Ag/InCeO films to the flexible plastic substrate.

39. The method of claim 1 wherein the method further comprises a post-deposition annealing step at ambient conditions.

40. The method of claim 38 wherein the post-deposition annealing step comprises annealing the film at a temperature of between about 75.degree. C. and about 250.degree. C. for from about 0.5 hour to about 2 hours.

41. The method of claim 39 wherein the post-deposition annealing step comprises annealing the film at a temperature of between about 75.degree. C. and about 145.degree. C. for from about 1.0 hour to about 2 hours.

42. The method of claim 40 wherein the post-deposition annealing step comprises annealing the film at a temperature of about 140.degree. C. for about 2 hours.

43. The method of claim 40 wherein the post-deposition annealing step enhances the adhesion and smooth the surface of the InCeO/Ag/InCeO films, and induces the reduction of sheet resistance and the increase of both transmittance and brightness of the films.

44. The method of claim 1 wherein the composite film has a transmittance of at least about 80%.

45. The method of claim 42 wherein the composite film has a transmittance of at least about 90%.

46. The method of claim 42 wherein the composite film has a brightness of at least about 80%.

47. The method of claim 1 wherein the composite film has an electrical resistance of no greater than about 20 .OMEGA./square.

48. The method of claim 44 wherein the composite film has an electrical resistance of no greater than about 10 .OMEGA./square.

49. The method of claim 45 wherein the composite film has an electrical resistance of no greater than about 5 .OMEGA./square.

50. The method of claim 1 wherein the composite film has a root-mean-square roughness of no greater than about 5 nm.

51. The method of claim 47 wherein the composite film has a root-mean-square roughness of no greater than about 2.5 nm.

52. The method of claim 51 further comprising a post-deposition annealing step and wherein the composite film has a root-mean-square roughness of no greater than about 1.5 nm.

53. The method of claim 1 wherein the composite film is stable to a 500-hour exposure at 60.degree. C. and 90% relative humidity.

54. The method of claim 1 wherein the composite film has interlayer adhesion sufficiently great to survive a 180.degree. peel adhesion test.

55. The method of claim 1 wherein the composite film is wet and dry etchable.

56. The method of claim 1 wherein the composite film includes a hard coating and is laser etchable.

57. The method of claim 1 wherein the composite film has a brightness L of at least about 80.0%, a red to green shift a of between about 0 and about 7.00 and a blue to yellow shift b of between about 0 and about 7.00.

58. A composite film made by the process of claim 1.

59. The composite film of claim 58 wherein the thin-film deposition technique is selected from the group consisting of DC or RE magnetron sputtering, ion beam deposition, chemical vapor deposition, ion beam enhanced deposition, and laser ablation deposition.

60. The composite film of claim 59 wherein the thin-film deposition technique is DC magnetron sputtering.

61. The composite film of claim 59 wherein the thin-film deposition technique is ion beam deposition.

62. The composite film of claim 59 wherein the thin-film deposition technique is chemical vapor deposition.

63. The composite film of claim 59 wherein the thin-film deposition technique is ion beam enhanced deposition.

64. The composite film of claim 59 wherein the thin-film deposition technique is laser ablation deposition.

65. The composite film of claim 60 wherein the DC magnetron sputtering is performed at a maximum sputter power of from about 300 watts to about 2000 watts.

66. The composite film of claim 65 wherein the DC magnetron sputtering is performed at a sputter power sequence of from about 500 watts to about 800 watts, followed by from about 50 watts to about 100 watts, followed by from about 500 watts to about 800 watts.

67. The composite film of claim 66 wherein the DC magnetron sputtering is performed at a sputter power sequence of about 600 watts, followed by about 70 watts, followed by about 600 watts.

68. The composite film of claim 60 wherein the deposition distance for DC magnetron sputtering is from about 2 inches to about 12 inches.

69. The composite film of claim 68 wherein the deposition distance for DC magnetron sputtering is from about 9 inches to about 11 inches.

70. The composite film of claim 58 wherein the DC magnetron sputtering is performed in an atmosphere that contains argon, and optionally, oxygen.

71. The composite film of claim 70 wherein the atmosphere contains oxygen in the deposition of InCeO films.

72. The composite film of claim 71 wherein the flow rate of oxygen is from about 0.2 to about 2.0 standard cubic centimillitor.

73. The composite film of claim 72 wherein the flow rate of oxygen is from about 0.2 to about 1.0 standard cubic centimillitor.

74. The composite film of claim 73 wherein the flow rate of oxygen is from about 0.2 to about 0.6 standard cubic centimillitor.

75. The composite film of claim 71 wherein the flow rate of argon is from about 5.0 to about 20.0 standard cubic centimillitor.

76. The composite film of claim 75 wherein the flow rate of argon is about 10.0 standard cubic centimillitor.

77. The composite film of claim 58 wherein line speed during deposition is from about 0.6 to about 4 feet/mm.

78. The composite film of claim 77 wherein the line speed during deposition is about 0.6 to 1.2 feet/mm.

79. The composite film of claim 78 wherein the thin conductive metallic film is an InCeO/Ag/InCeO metallic film and the line speed during deposition is about 0.7 feet/mm during deposition of the InCeO layers and is about 0.8 feet/mm during deposition of the Ag layers.

80. The composite film of claim 58 wherein the method further comprises the step of purging the surface of the flexible plastic substrate prior to film deposition.

81. The composite film of claim 80 wherein the step of purging the surface of the flexible plastic substrate prior to film deposition is performed with a plasma selected from the group consisting of the group of Ar+O.sub.2, Ar, and Ar+N.sub.2.

82. The composite film of claim 81 wherein the step of purging the surface of the flexible plastic substrate prior to film deposition is performed with a Ar+O.sub.2 plasma.

83. The composite film of claim 58 wherein the thin conductive metallic film is an InCeO/Ag/InCeO film.

84. The composite film of claim 83 wherein the thickness of the InCeO layers is from about 10 nm to about 100 nm and the thickness of the Ag layer is from about 7 nm to about 20 nm.

85. The composite film of claim 84 wherein the thickness of the InCeO layers is from about 30 nm to about 45 nm and the thickness of the Ag layer is from about 12 nm to about 16 nm.

86. The composite film of claim 83 wherein the Ag of the InCeO/Ag/InCeO film is doped with about 1 atom percent of Au and about 0.5 atom percent of Cu to enhance the stability of the silver atoms in the silver layer.

87. The composite film of claim 58 wherein the conductive metallic film is selected from the group consisting of silver, gold, and their alloys.

88. The composite film of claim 58 wherein the flexible plastic substrate is selected from the group consisting of polyethylene terephthalate (PET), polyethylene naphthalate (PEN), polyethersulfone (PBS), polycarbonate (PC), polysulfone, a phenolic resin, an epoxy resin, polyester, polyimide, polyetherester, polyetheramide, cellulose acetate, aliphatic polyurethanes, polyacrylonitrile, polytetrafluoroethylenes, polyvinylidene fluorides, poly (methyl .alpha.-methacrylates) and an aliphatic or cyclic polyolefin.

89. The composite film of claim 88 wherein the flexible plastic substrate is a cyclic polyolefin.

90. The composite film of claim 89 wherein the cyclic polyolefin is poly(bis(cyclopentadiene)).

91. The composite film of claim 90 wherein the flexible plastic substrate is a polyester.

92. The composite film of claim 91 wherein the polyester is an aromatic polyester.

93. The composite film of claim 88 wherein the flexible plastic substrate is reinforced with a hard coating.

94. The composite film of claim 93 wherein the hard coating is an acrylic coating.

95. The composite film of claim 58 wherein the process for producing the composite film further comprises a post-deposition annealing step at ambient conditions.

96. The composite film of claim 95 wherein the post-deposition annealing step comprises annealing the film at a temperature of between about 75.degree. C. and about 250.degree. C. for from about 0.5 hour to about 2 hours.

97. The composite film of claim 96 wherein the post-deposition annealing step comprises annealing the film at a temperature of between about 75.degree. C. and about 145.degree. C. for from about 1.0 hour to about 2 hours.

98. The composite film of claim 97 wherein the post-deposition annealing step comprises annealing the film at a temperature of about 140.degree. C. for about 2 hours.

99. The composite film of claim 58 wherein the composite film has a transmittance of at least about 80%.

100. The composite film of claim 99 wherein the composite film has a transmittance of at least about 90%.

101. The composite film of claim 58 wherein the composite film has an electrical resistance of no greater than about 20 .OMEGA./square.

102. The composite film of claim 101 wherein the composite film has an electrical resistance of no greater than about 10 .OMEGA./square.

103. The composite film of claim 102 wherein the composite film has an electrical resistance of no greater than about 5 .OMEGA./square.

104. The composite film of claim 58 wherein the composite film has a root-mean-square roughness of no greater than about 5 nm.

105. The composite film of claim 104 wherein the composite film has a root-mean-square roughness of no greater than about 2.5 nm.

106. The composite film of claim 105 wherein the process for producing the composite film further comprises a post-deposition annealing step and wherein the composite film has a root-mean-square roughness of no greater than about 1.5 nm.

107. The composite film of claim 58 wherein the composite film is stable to a 500 hour exposure at 60.degree. C. in 90% relative humidity.

108. The composite film of claim 58 wherein the composite film has interlayer adhesion sufficiently great to survive a 180.degree. peel adhesion test.

109. The composite film of claim 58 wherein the composite film is wet and dry etchable.

110. The composite film of claim 58 wherein the composite film includes a hard coating and is laser etchable.

111. The composite film of claim 58 wherein the composite film has a brightness L of at least about 80.0, a red to green shift a between about 0 and about 7.00, and a blue to yellow shift b between about 0 and about 7.00.

112. A multilayered electrode/substrate structure comprising the composite film of claim 58.

113. The multilayered electrode/substrate structure of claim 112 wherein the multilayered electrode/substrate structure is an OLED.

114. The multilayered electrode/substrate structure of claim 112 wherein the multilayered electrode/substrate structure is a PLED.

115. The multilayered electrode/substrate structure of claim 112 wherein the multilayered electrode/substrate structure has surface roughness of less than about 8 nm.

116. The multilayered electrode/substrate structure of claim 112 wherein the multilayered electrode/substrate structure has a driving voltage of less than about 20 volts.

117. The multilayered electrode/substrate structure of claim 112 wherein the multilayered electrode/substrate structure includes a conductive material that is a light-emitting polymer.

118. The multilayered electrode/substrate structure of claim 117 wherein the light-emitting polymer is selected from the group consisting of poly(p-phenylenevinylene) (PPV), poly(dialkoxyphenylenevinylene), poly(thiophene), poly(fluorene), poly(phenylene), poly(phenylacetylene), poly(aniline), poly(3-alkylthiophene), poly(3-octylthiophene), and poly(N-vinylcarbazole).

119. The multilayered electrode/substrate structure of claim 118 wherein the light-emitting polymer is poly(p-phenylenevinylene) (PPV).

120. The multilayered electrode/substrate structure of claim 118 wherein the light-emitting polymer is poly (fluorene).

121. The multilayered electrode/substrate structure of claim 112 wherein the multilayered electrode/substrate structure includes a conductive material that is a luminescent organic or organometallic material.

122. The multilayered electrode/substrate structure of claim 121 wherein the luminescent organic or organometallic material is selected from the group consisting of metal ion salts of 8-hydroxyquinolate, trivalent metal quinolate complexes, trivalent metal bridged quinolate complexes, Schiff base divalent metal complexes, tin (IV) metal complexes, metal acetylacetonate complexes, metal bidentate ligand complexes incorporating an organic ligand selected from the group consisting of 2-picolylketones, 2-quinaldylketones, and 2-(o-phenoxy) pyridine ketones, bisphosphonates, divalent metal maleonitriledithiolate complexes, molecular charge transfer complexes, rare earth mixed chelates, (5-hydroxy) quinoxaline metal complexes, and aluminum tris-quinolates.

123. A composite film comprising an InCeO/Ag/InCeO metallic film coated or deposited on a flexible plastic substrate, wherein the composite film: (1) has a transmittance of at least 80% in the visible region; (2) has an electrical resistance of no greater than about 20 .OMEGA./ square; (3) has a root-mean-square roughness of no greater than about 5 nm; and (4) has an interlayer adhesion between the InCeO/Ag/InCeO metallic film and other elements of the composite film that is sufficiently great to survive a 180.degree. peel adhesion test.

124. The composite film of claim 123 wherein the transmittance is at least 90% in the visible region, the electrical resistance is no greater than about 10 .OMEGA./square, and the root-mean-square roughness is no greater than about 2.5 nm.

125. The composite film of claim 123 wherein the composite film further comprises a reinforcing hard coating located between the InCeO/Ag/InCeO metallic film and the flexible plastic substrate.

126. The composite film of claim 125 wherein the reinforcing hard coating is an acrylic coating.

127. The composite film of claim 126 wherein the flexible plastic substrate is selected from the group consisting of polyethylene terephthalate (PET), polyethylene naphthalate (PEN), polyethersulfone (PES), polycarbonate (PC), polysulfone, a phenolic resin, an epoxy resin, polyester, polyimide, polyetherester, polyetheramide, cellulose acetate, aliphatic polyurethanes, polyacrylonitrile, polytetrafluoroethylenes, polyvinylidene fluorides, poly (methyl .alpha.-methacrylates) and an aliphatic or cyclic polyolefin.

128. The composite film of claim 127 wherein the flexible plastic substrate is a cyclic polyolefin.

129. The composite film of claim 128 wherein the cyclic polyolefin is poly(bis(cyclopentadiene)).

130. The composite film of claim 127 wherein the flexible plastic substrate is a polyester.

131. The composite film of claim 130 wherein the polyester is an aromatic polyester.

132. The method of claim 1, wherein the composite film has a transmittance of at least 80% in the visible region.

133. The method of claim 1, wherein the composite film has a transmittance of at least 90% in the visible region.

* * * * *

UNITED STATES PATENT AND TRADEMARK OFFICE
CERTIFICATE OF CORRECTION

PATENT NO. : 6,811,815 B2
DATED : November 2, 2004
INVENTOR(S) : Xiao-Ming He and Ramin Heydarpour It is certified that error appears in the above-identified patent and that said Letters Patent is hereby corrected as shown below:

<u>Title page,</u>
Item [56], References Cited, U.S. PATENT DOCUMENTS, add:
-- 2002/0086164 A1    7/2002    Anzaki et al.
   2002/0110673 A1    8/2002    Heydarpour et al.
   2002/0163614 A1    11/2002   Hinata et al. --
FOREIGN PATENT DOCUMENTS, add:
-- EP    1043606 A1    10/2000 --

Signed and Sealed this

Eighth Day of February, 2005

JON W. DUDAS
*Director of the United States Patent and Trademark Office*